United States Patent
Ishii et al.

(10) Patent No.: US 10,346,068 B2
(45) Date of Patent: Jul. 9, 2019

(54) MEMORY SYSTEM AND METHOD OF PERFORMING A READ OPERATION ON A MEMORY CELL OF A NON-VOLATILE SEMICONDUCTOR STORAGE DEVICE INCLUDING A PLURALITY OF BLOCKS OF MEMORY

(71) Applicant: Toshiba Memory Corporation, Tokyo (JP)

(72) Inventors: Hiroyuki Ishii, Kamakura Kanagawa (JP); Yuji Nagai, Sagamihara Kanagawa (JP); Yukihiro Utsuno, Yokohama Kanagawa (JP); Katsuki Matsudera, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/693,430

(22) Filed: Aug. 31, 2017

(65) Prior Publication Data

US 2018/0246660 A1  Aug. 30, 2018

(30) Foreign Application Priority Data

Feb. 28, 2017  (JP) .................................. 2017-036565

(51) Int. Cl.
*G06F 3/06* (2006.01)
*G11C 7/20* (2006.01)
*G11C 11/56* (2006.01)

(52) U.S. Cl.
CPC ............ *G06F 3/0619* (2013.01); *G06F 3/065* (2013.01); *G06F 3/0679* (2013.01); *G11C 7/20* (2013.01); *G11C 11/5642* (2013.01)

(58) Field of Classification Search
CPC ....... G06F 3/0679; G06F 3/0619; G06F 3/065
USPC .......................................................... 711/103
See application file for complete search history.

(56) References Cited

U.S. PATENT DOCUMENTS

| | | | |
|---|---|---|---|
| 7,412,616 B2 | 8/2008 | Matsui et al. | |
| 8,929,140 B2 | 1/2015 | Nagashima | |
| 8,942,040 B2 | 1/2015 | Shirakawa | |
| 9,645,177 B2 | 5/2017 | Cohen et al. | |
| 2016/0203047 A1* | 7/2016 | No ...................... | G06F 11/1068 714/764 |
| 2016/0217863 A1* | 7/2016 | An ......................... | G11C 16/14 |

* cited by examiner

*Primary Examiner* — Hua J Song
(74) *Attorney, Agent, or Firm* — Kim & Stewart LLP

(57) ABSTRACT

A memory system includes a semiconductor storage device including a plurality of blocks of memory cells, each memory cell storing data in a non-volatile state, a controller configured to issue commands to the semiconductor storage device to perform various operations, including a read operation, a write operation, an erase operation, and a dummy operation. The read operation is an operation in which the semiconductor storage device reads data from a memory cell of a block in the semiconductor storage device, and outputs the read data to the controller, and the dummy operation is an operation in which the semiconductor storage device reads data from a memory cell of a block in the semiconductor storage device and does not output the read data to the controller and does not write the data to any of the memory cells of the blocks in the semiconductor storage device.

20 Claims, 24 Drawing Sheets

MEMORY SYSTEM AND METHOD OF PERFORMING A READ OPERATION ON A MEMORY CELL OF A NON-VOLATILE SEMICONDUCTOR STORAGE DEVICE INCLUDING A PLURALITY OF BLOCKS OF MEMORY

CROSS-REFERENCE TO RELATED APPLICATION

This application is based upon and claims the benefit of priority from Japanese Patent Application No. 2017-036565, filed Feb. 28, 2017, the entire contents of which are incorporated herein by reference.

FIELD

Embodiments described herein relate generally to a memory system.

BACKGROUND

A memory system including a NAND-type flash memory has been known.

DETAILED DESCRIPTION

Figure 1:
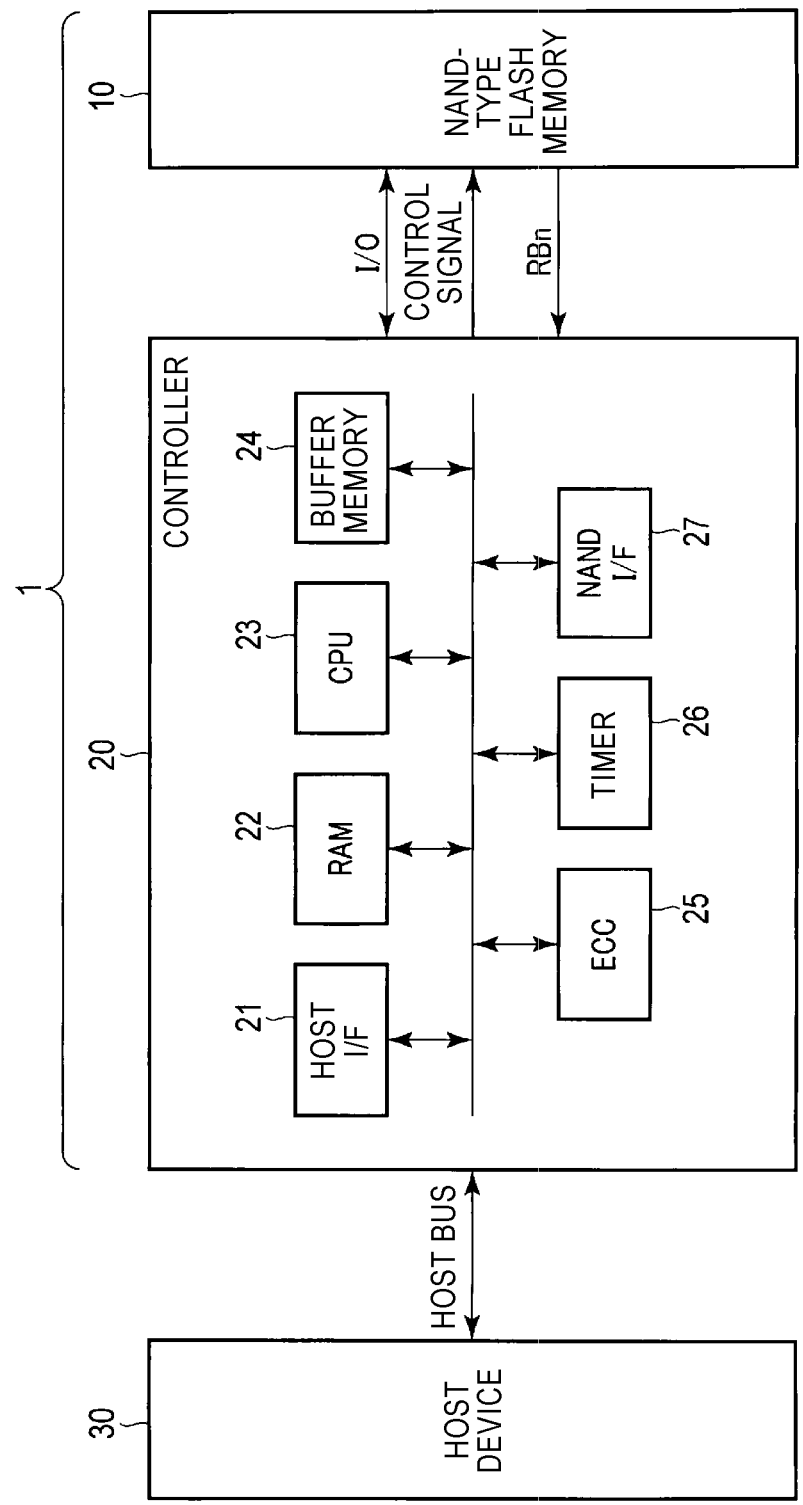
FIG. 1 is a block diagram of a memory system according to a first exemplary embodiment.

Embodiments provide a semiconductor storage device capable of improving the reliability of a read operation.

In general, according to one embodiment, a memory system includes a semiconductor storage device including a plurality of blocks of memory cells, each memory cell storing data in a non-volatile state, a controller configured to issue commands to the semiconductor storage device to perform various operations, including a read operation, a write operation, an erase operation, and a dummy operation. The read operation is an operation in which the semiconductor storage device reads data from a memory cell of a block in the semiconductor storage device, and outputs the read data to the controller, and the dummy operation is an operation in which the semiconductor storage device reads data from a memory cell of a block in the semiconductor storage device and does not output the read data to the controller and does not write the data to any of the memory cells of the blocks in the semiconductor storage device.

Hereinafter, exemplary embodiments will be described with reference to the drawings. The drawings are schematic. Each exemplary embodiment exemplifies an apparatus or a method for embodying the technical idea disclosed herein.

In the following description, constituent elements having substantially the same functions and configurations are denoted by the same reference numerals. A number following characters constituting a reference numeral, or the "under bar+a character" attached to characters constituting a reference numeral is referred to by a reference numeral including the same characters and is used to distinguish between elements having the same configuration. When there is no need to distinguish between elements indicated by reference numerals having the same characters, these elements are referred to by reference numerals only.

[1] First Exemplary Embodiment

Hereinafter, a memory system according to the first exemplary embodiment will be described. [1-1] Configuration

[1-1-1] Configuration of Memory System 1

First, the configuration of the memory system 1 will be described with reference to FIG. 1. FIG. 1 illustrates a block diagram of the memory system 1. As illustrated in FIG. 1, the memory system 1 includes a semiconductor storage device 10 and a controller 20, and is connected to an external host device 30.

The semiconductor storage device 10 is a NAND-type flash memory that stores data in a non-volatile state. The configuration of the semiconductor storage device 10 will be described below.

The controller 20 instructs the semiconductor storage device 10 to perform reading, writing, erasing, and the like in response to a command from the host device 30. As illustrated in FIG. 1, the controller 20 includes a host interface circuit 21, a built-in memory (RAM) 22, a central processing unit (CPU) 23, a buffer memory 24, an ECC circuit 25, a timer 26, and a NAND interface circuit 27.

The host interface circuit 21 is connected to the host device 30 via a host bus, and manages communication with the host device 30. For example, the host interface circuit 21 transmits a command and data received from the host device 30 to the CPU 23 and the buffer memory 24, respectively. In response to a command of the CPU 23, the host interface circuit 21 transmits data in the buffer memory 24 to the host device 30.

The RAM 22 is, for example, a semiconductor memory such as a DRAM, and holds firmware used for managing the semiconductor storage device 10, various management tables, or the like. The RAM 22 is used as a work area of the CPU 23.

The CPU 23 controls the overall operation of the controller 20. For example, in response to a write command received from the host device 30, the CPU 23 issues a write command to the NAND interface circuit 27. This operation is the same in the case of reading and erasing. The CPU 23 executes various processes for managing a memory space of the semiconductor storage device 10, such as wear leveling.

The buffer memory 24 temporarily holds read data received from the semiconductor storage device 10 by the controller 20, write data received from the host device 30, or the like.

The ECC circuit 25 performs an error checking and correcting (ECC) process of data. Specifically, the ECC circuit 25 generates a parity based on write data when the data are written. Then, the ECC circuit 25 generates a syndrome from the parity when data are read, and detects an error, and then corrects the detected error.

The timer 26 is used in various operations. For example, the timer 26 may measure the amount of time elapsed since the controller 20 has caused the semiconductor storage device 10 to execute a predetermined operation.

The NAND interface circuit 27 is connected to the semiconductor storage device 10 via a NAND bus, and manages communication with the semiconductor storage device 10. The signals exchanged between the semiconductor storage device 10 and the controller 20 follow the NAND interface protocol. For example, the NAND interface circuit 27 transmits/receives input/output signals I/O to/from the semiconductor storage device 10, transmits various control signals based on the commands received from the CPU 23 to the semiconductor storage device 10, and receives a ready/busy signal RBn from the semiconductor storage device 10. Details of these signals will be described below.

Examples of the host device 30 using the memory system 1 as described above, include a digital camera, a personal computer, or the like.

The semiconductor storage device 10 and the controller 20 may be combined with each other so as to constitute, for example, a single semiconductor device. Examples of such a semiconductor device include a memory card such as a SD™ card, a solid state drive (SSD) or the like.

[1-1-2] Configuration of Semiconductor Storage Device 10

Figure 2:
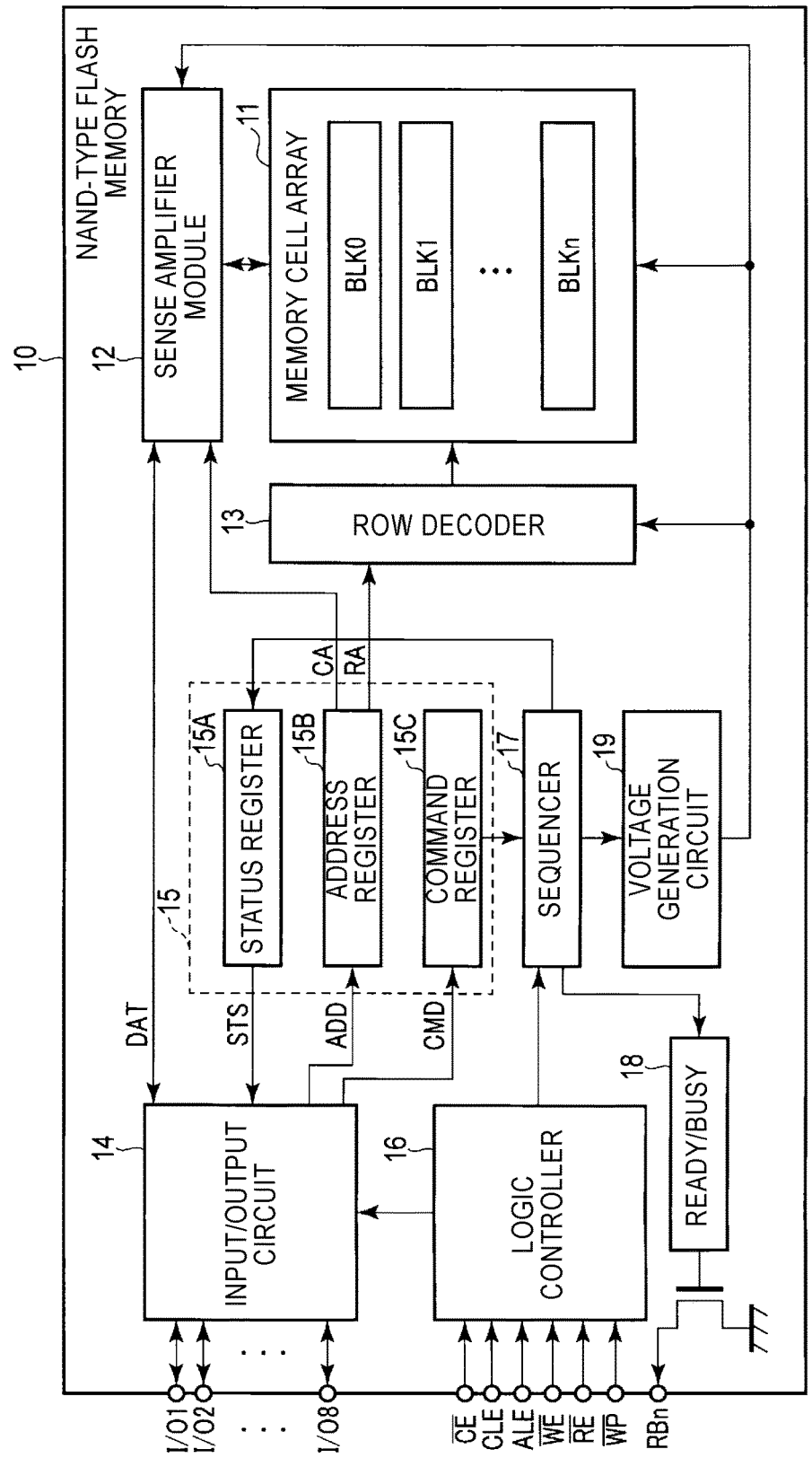
FIG. 2 is a block diagram of a semiconductor storage device according to the first exemplary embodiment.

Next, the configuration of the semiconductor storage device 10 will be described with reference to FIG. 2. FIG. 2 illustrates a block diagram of the semiconductor storage device 10. As illustrated in FIG. 2, the semiconductor storage device 10 includes a memory cell array 11, a sense amplifier module 12, a row decoder 13, an input/output circuit 14, a register 15, a logic controller 16, a sequencer 17, a ready/busy control circuit 18, and a voltage generation circuit 19.

The memory cell array 11 includes blocks BLK0 to BLKn (n is a natural number of 1 or more). The blocks BLK are a set of a plurality of non-volatile memory cells associated with bit lines and word lines, and are, for example, units of data erasure. The semiconductor storage device 10 is capable of holding data by applying a single-level cell (SLC) method in which 1-bit data are stored in each memory cell or a multi-level cell (MLC) method in which data of 2 bits or more are stored in each memory cell.

The sense amplifier module 12 outputs data DAT read from the memory cell array 11 to the controller 20 via the input/output circuit 14. The sense amplifier module 12 transmits write data DAT received from the controller 20 via the input/output circuit 14 to the memory cell array 11.

The row decoder 13 selects a word line corresponding to a memory cell on which a read operation and a write operation are to be performed. Then, the row decoder 13 applies desired voltages to the selected word line and an unselected word line, respectively.

The input/output circuit 14 transmits/receives, for example, input/output signals I/O (I/O1 to I/O8) with an 8-bit width to/from the controller 20. For example, the input/output circuit 14 transmits write data DAT included in the input/output signal I/O received from the controller 20, to the sense amplifier module 12. The input/output circuit 14 transmits read data DAT transmitted from the sense amplifier module 12 to the controller 20 as the input/output signal I/O.

The register 15 includes a status register 15A, an address register 15B, and a command register 15C. The status register 15A holds status information STS. The status information STS includes, for example, information indicating an operation state of the sequencer 17. The address register 15B receives address information ADD from the input/output circuit 14, and holds the address information ADD. Then, the address register 15B transmits a column address signal CA and a row address signal RA included in the address information ADD to the sense amplifier module 12 and the row decoder 13, respectively. The command register 15C receives a command CMD from the input/output circuit 14, and holds the command CMD. Then, based on the command CMD held in the command register 15C, the sequencer 17 executes various operations.

The logic controller 16 receives various control signals from the controller 20, and controls the input/output circuit 14 and the sequencer 17. As the control signals, for example, a chip enable signal /CE, a command latch enable signal CLE, an address latch enable signal ALE, a write enable signal /WE, a read enable signal /RE, and a write protect signal /WP are used. The signal /CE is a signal that enables the semiconductor storage device 10. The signal CLE is a signal that notifies the input/output circuit 14 that a signal input to the semiconductor storage device 10 in parallel with an asserted signal CLE is a command CMD. The signal ALE is a signal that notifies the input/output circuit 14 that a signal input to the semiconductor storage device 10 in a parallel with an asserted signal ALE is address information ADD. The signal /WE and the signal /RE are signals that instruct the input/output circuit 14 to input and output, for example, input/output signals I/O1 to I/O8, respectively. The signal /WP is a signal for protecting the semiconductor storage device 10, for example, when power is turned ON/OFF.

The sequencer 17 controls the overall operation of the semiconductor storage device 10. Specifically, the sequencer 17 controls the sense amplifier module 12, the row decoder 13, the voltage generation circuit 19, and the like based on the command CMD transmitted from the command register 15C, and executes a write operation, a read operation, and the like of data.

The ready/busy control circuit 18 generates a ready/busy signal RBn based on the operation state of the sequencer 17, and transmits the signal RBn to the controller 20. The signal RBn is a signal that notifies the controller 20 whether the semiconductor storage device 10 is placed in a ready state where a command from the controller 20 is received or a busy state where the command is not received.

The voltage generation circuit 19 generates a desired voltage based on the instruction of the sequencer 17. Then, the voltage generation circuit 19 supplies the generated voltage to the memory cell array 11, the sense amplifier module 12, and the row decoder 13.

[1-1-3] Configuration of Memory Cell Array 11

Figure 3:
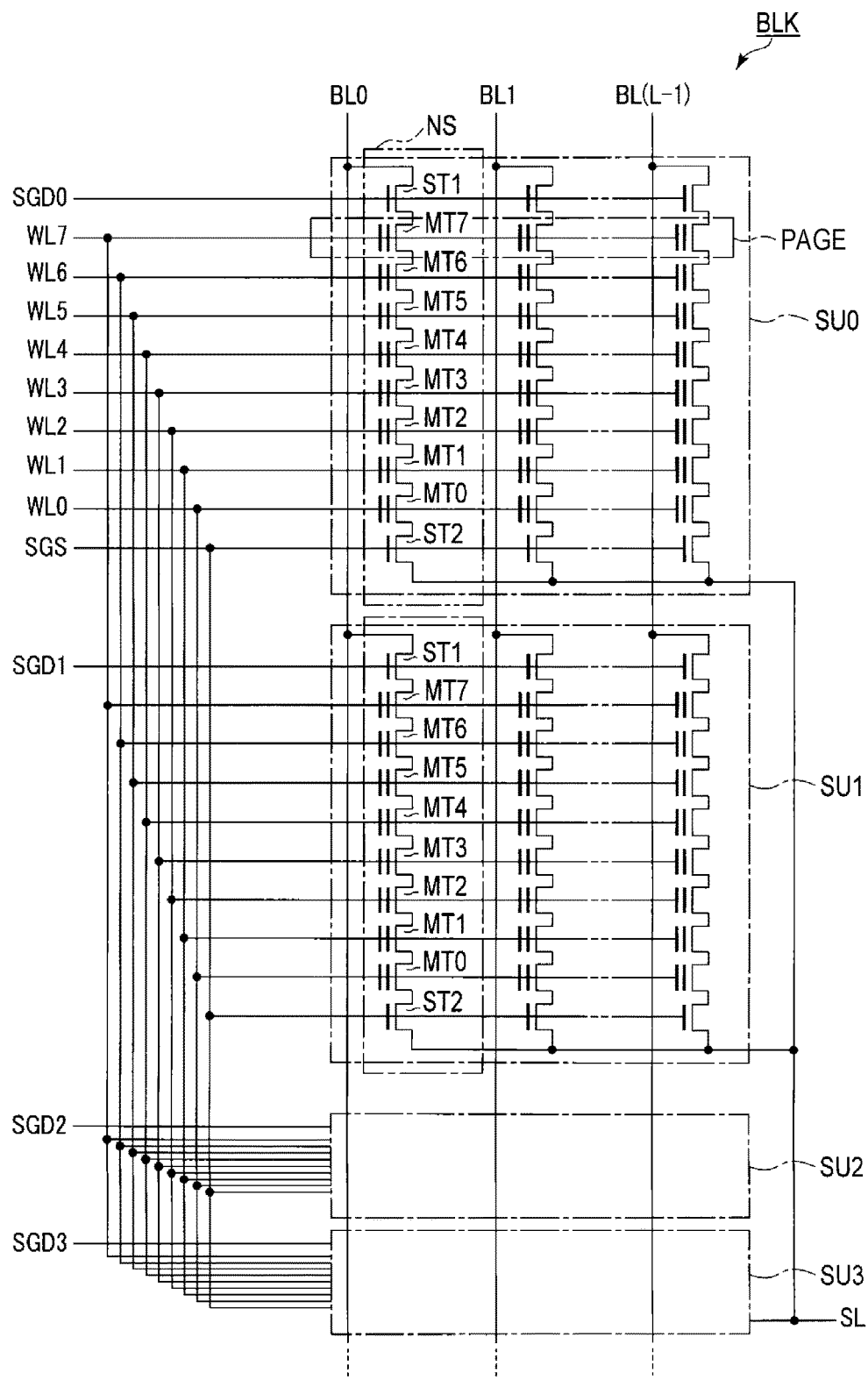
FIG. 3 is a circuit diagram of a memory cell array included in the semiconductor storage device according to the first exemplary embodiment.

Next, the circuit configuration of the memory cell array 11 will be described with reference to FIG. 3. FIG. 3 is a circuit diagram of the memory cell array 11, and illustrates a detailed circuit configuration of one block BLK within the memory cell array 11. As illustrated in FIG. 3, the block BLK includes, for example, string units SU0 to SU3.

Each of the string units SU includes a plurality of NAND strings NS. The plurality of NAND strings NS included in each string unit SU are provided corresponding to bit lines BL0 to BL(L−1) ((L−1) is a natural number of 1 or more), respectively. Each of the NAND strings NS includes, for example, eight memory cell transistors MT (MT0 to MT7), and select transistors ST1 and ST2.

Each memory cell transistor MT includes a control gate and a charge storage layer, and holds data in a non-volatile manner. The memory cell transistors MT0 to MT7 are connected in series between the source of the select transistor ST1 and the drain of the select transistor ST2. Each of the control gates of the memory cell transistors MT0 to MT7 within the same block BLK is commonly connected to word lines WL0 to WL7.

Each of the gates of the select transistors ST1 within the string units SU0 to SU3 is commonly connected to select gate lines SGD0 to SGD3. The drains of the select transistors ST1 in the same column within the same block BLK are commonly connected to a corresponding bit line BL, and the drains of the select transistors ST1 in the same column are commonly connected across a plurality of blocks BLK via the corresponding bit line BL. The gates of the select transistors ST2 within the same block are commonly connected to a select gate line SGS. The sources of the select transistors ST2 within the same block are commonly connected to a source line SL. The sources of the select transistors ST2 are commonly connected across a plurality of blocks BLK via the source line SL.

In the above configuration, a set of 1-bit data held by a plurality of memory cell transistors MT connected to a common word line WL is referred to as a "page." Accordingly, when 2-bit data are stored in one memory cell transistor MT, data of two pages are stored in a set of a plurality of memory cell transistors MT connected to one word line WL. The semiconductor storage device 10 may perform writing and reading of data for each page or each word line WL.

The number of string units SU included in one block BLK, and the number of memory cell transistors MT included in one NAND string NS, as described above, are not limited to these. That is, any number of string units SU may be included in one block BLK, and any number of memory cell transistors MT may be included in one NAND string NS.

Figure 4:
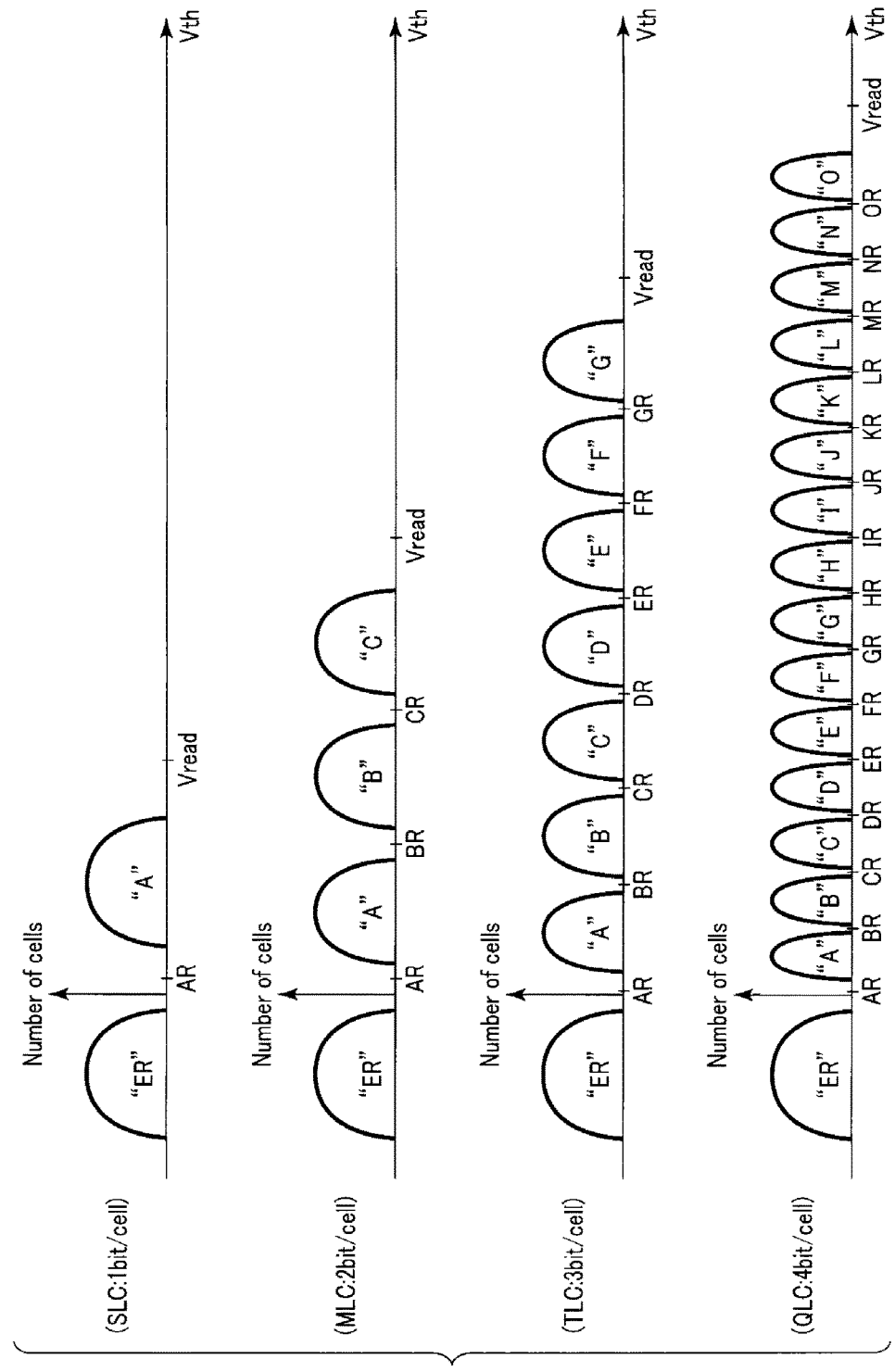
FIG. 4 is a view illustrating a threshold voltage distribution of a memory cell included in the semiconductor storage device according to the first exemplary embodiment.

The threshold voltage distribution of the memory cell transistor MT as described above is illustrated in, for example, FIG. 4. FIG. 4 illustrates a threshold voltage distribution, and a voltage used for a read operation when one memory cell transistor MT holds 1-bit data to 4-bit data. The vertical axis and the horizontal axis in FIG. 4 correspond to the number of memory cell transistors MT and the threshold voltage Vth, respectively, and 1-bit data or multi-bit data are allocated to each threshold voltage distribution illustrated in FIG. 4.

In the case of the SLC system in which 1-bit data are held in one memory cell transistor MT, the distribution of the threshold voltage is divided into two. The two threshold voltage distributions are referred to as an "ER" level, and an "A" level in order from the lowest threshold voltage. In the case of the MLC method in which 2-bit data are held in one memory cell transistor MT, the distribution of the threshold voltage is divided into four. The four threshold voltage distributions are referred to as an "ER" level, an "A" level, a "B" level, and a "C" level in order from the lowest threshold voltage. In the case of a triple-level cell (TLC) method in which 3-bit data are held in one memory cell transistor MT, the distribution of the threshold voltage is divided into eight. The eight threshold voltage distributions are referred to as an "ER" level, an "A" level, a "B" level, . . . , a "G" level in order from the lowest threshold voltage. In the case of a quadruple-level cell (QLC) method in which 4-bit data are held in one memory cell transistor MT, the distribution of the threshold voltage is divided into 16. The 16 threshold voltage distributions are referred to as an "ER" level, an "A" level, a "B" level, . . . , an "O" level in order from the lowest threshold voltage.

In the threshold voltage distribution described above, each read voltage is set between adjacent threshold voltage distributions. For example, a read voltage AR used for determining whether a certain memory cell transistor MT has a threshold voltage of an "ER" level or a threshold voltage of an "A" level or more is set between a maximum threshold voltage at the "ER" level and a minimum threshold voltage at the "A" level. Other read voltages BR, CR, . . . , and OR are also set similarly to the read voltage AR. A read pass voltage Vread is set higher than a maximum threshold voltage in the highest threshold voltage distribution in each method. That is, the memory cell transistor MT having a gate to which the voltage Vread is applied is turned ON regardless of the data held therein. As for various read voltages and read pass voltages Vread, the same or different voltage values may be applied in respective methods. For example, values of the voltages Vread in respective methods may be SLC method <MLC method <TLC method <QLC method, as illustrated in FIG. 4.

Figure 5:
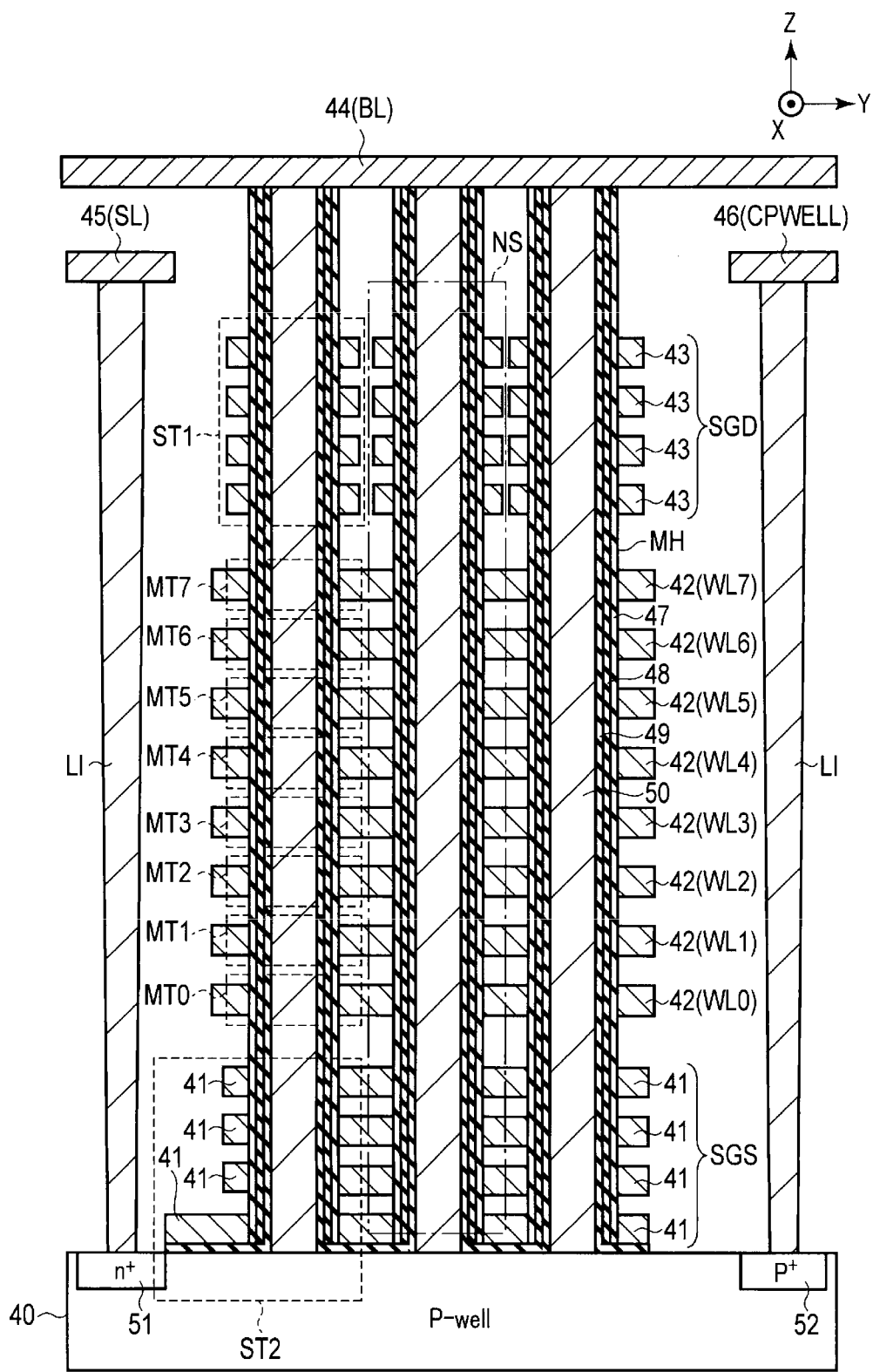
FIG. 5 is a sectional view of the memory cell array included in the semiconductor storage device according to the first exemplary embodiment.

Next, the sectional structure of the memory cell array 11 will be described with reference to FIG. 5. FIG. 5 illustrates a sectional view of the memory cell array 11, and X, Y, and Z axes crossing each other. In FIG. 5, an interlayer insulating film is omitted. As illustrated in FIG. 5, the semiconductor storage device 10 includes a P-well region 40, wiring layers 41 to 46, a plurality of semiconductor pillars MH, and a plurality of contact plugs LI.

The P-well region 40 is formed in the surface of a semiconductor substrate. The wiring layers 41 to 43 are sequentially stacked above the P-well region 40. The wiring layers 41 to 43 are provided in a plate shape extending in the X direction and the Y direction. The wiring layers 41 and 43 function as select gate lines SGS and SGD, respectively. To each of the select gate lines SGS and SGD, for example, a plurality of wiring layers may be allocated as illustrated in FIG. 5, or one wiring layer may be allocated. The wiring layers 42 function as word lines WL. To one word line WL, for example, one wiring layer among the stacked wiring layers 42 is allocated as illustrated in FIG. 5.

The plurality of semiconductor pillars MH are formed to extend from the top surface of the wiring layers 43 to the top surface of the P-well region 40. That is, the semiconductor pillars MH are provided to pass through the wiring layers 41 to 43 along the Z direction. On a side surface of the semiconductor pillar MH, a block insulating film 47, an insulating film 48 which functions as a charge storage layer, and a tunnel oxide film 49 are sequentially formed. In the semiconductor pillar MH, a semiconductor material 50, e.g., polysilicon, is buried inside the tunnel oxide film 49. The inside of the tunnel oxide film 49 of the semiconductor pillar MH may be made of a plurality of materials.

The wiring layer 44 corresponding to a bit line BL is formed above the wiring layer 43 and the semiconductor pillar MH. The bit line BL is connected to a corresponding semiconductor pillar MH. A contact plug containing a conductive material may be formed between the bit line BL and the corresponding semiconductor pillar MH.

The wiring layers 45 and 46 corresponding to a source line SL and a well line CPWELL, respectively, are formed in a layer between the wiring layer 43 and the wiring layer 44. The wiring layer 45 is connected to an n+ impurity diffusion area 51 formed in the surface of the well region 40 via the contact plug LI. The wiring layer 46 is connected to a p+ impurity diffusion area 52 formed in the surface of the well region 40 via the contact plug LI. The contact plug LI is provided in a plate shape extending in the X direction and the Z direction.

In the above described configuration, one semiconductor pillar MH corresponds to one NAND string NS. Specifically, intersections between the select gate lines SGD and SGS and the semiconductor pillars MH correspond to select transistors ST1 and ST2, respectively. Similarly, an intersection between a word line WL and a semiconductor pillar MH corresponds to a memory cell transistor MT.

A plurality of structures having the same configuration as described above, are arranged in the X direction. For example, one string unit SU is constituted by a set of a plurality of NAND strings NS arranged in the X direction. When a plurality of string units SU are provided in the same block BLK, the wiring layers 43 corresponding to the select gate lines SGD are separated between the string units SU.

In addition, the lowermost wiring layer 41 and the tunnel oxide film 49 are provided up to the vicinity of the n+ impurity diffusion area 51. Accordingly, when the select transistor ST2 is turned ON, a current path is formed between the NAND string NS and the n+ impurity diffusion area 51.

In addition, the memory cell array 11 may employ other configurations, such as the configuration described in U.S. patent application Ser. No. 12/407,403 filed on Mar. 19, 2009 and entitled "Three-dimensional Stacked Non-volatile Semiconductor Memory," U.S. patent application Ser. No. 12/406,524 filed on Mar. 18, 2009 and entitled "Three-dimensional Stacked Non-volatile Semiconductor Memory," U.S. patent application Ser. No. 12/679,991 filed on Mar. 25, 2010 and entitled "Non-volatile Semiconductor Storage Device and Manufacturing Method thereof," and U.S. patent application Ser. No. 12/532,030 filed on Mar. 23, 2009 and entitled "Semiconductor Memory and Manufacturing Method thereof." All of these patent applications are incorporated herein by reference in their entireties.

[1-1-4] Configuration of Sense Amplifier Module 12

Figure 6:
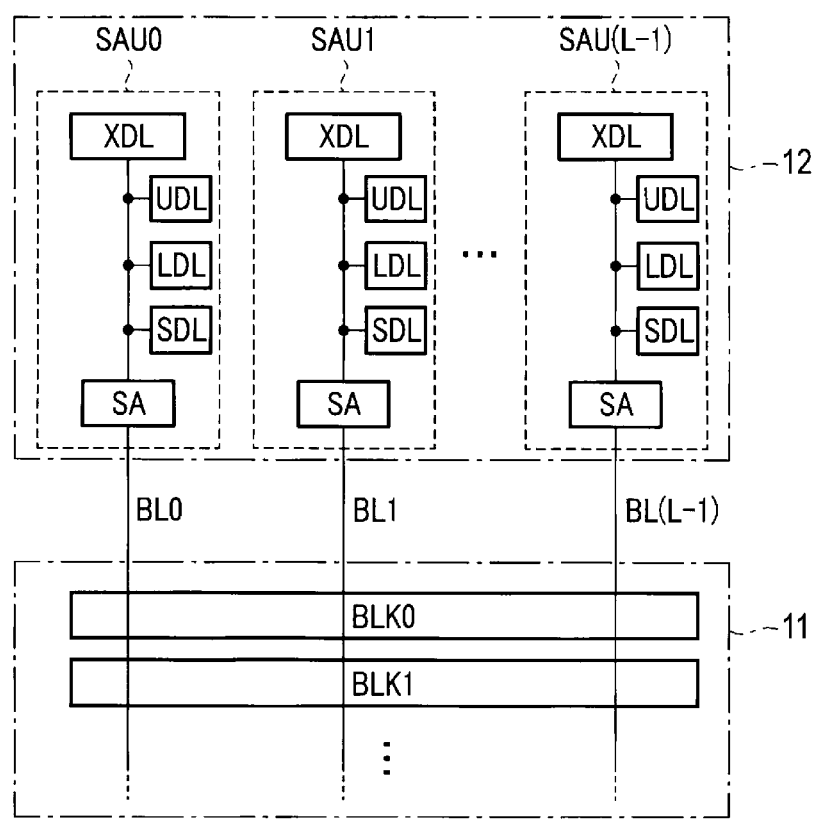
FIG. 6 is a block diagram of a sense amplifier module included in the semiconductor storage device according to the first exemplary embodiment.

Next, the configuration of the sense amplifier module 12 will be described with reference to FIG. 6. FIG. 6 illustrates a block diagram of the sense amplifier module 12. As illustrated in FIG. 6, the sense amplifier module 12 includes sense amplifier units SAU0 to SAU(L−1) corresponding to bit lines BL0 to BL(L−1), respectively.

Each sense amplifier unit SAU includes a sense amplifier SA, and latch circuits SDL, LDL, UDL, and XDL. In each sense amplifier unit SAU, the sense amplifier SA, and the latch circuits SDL, LDL, UDL, and XDL are connected so as to transmit/receive data to/from each other.

During a read operation, the sense amplifier SA senses a bit line BL connected to a memory cell transistor MT that is read, and determines whether the read data is "0" or "1." During a write operation, the sense amplifier SA applies a voltage to a bit line BL based on write data.

The latch circuits SDL, LDL, and UDL temporarily hold the read data and write data. The read data determined by the sense amplifier SA during the read operation and the write data transmitted to the latch circuit XDL during the write operation are transmitted to, for example, any one of the latch circuits SDL, LDL, and UDL.

The latch circuit XDL is used for inputting and outputting data between the sense amplifier unit SAU and the input/output circuit 14. That is, data received from the input/output circuit 14 are transmitted to the latch circuit SDL, LDL, or UDL, or the sense amplifier SA via the latch circuit XDL. The data of the latch circuit SDL, LDL, or UDL, or the sense amplifier SA are transmitted to the input/output circuit 14 via the latch circuit XDL.

The configuration of the sense amplifier module 12 is not limited to that described above, but may be modified in various ways. For example, the number of latch circuits included in the sense amplifier unit SAU is not limited, and the sense amplifier unit SAU may be designed to have a number of latch circuits that is equal to the number of bits of data that can be programmed in one memory cell transistor MT.

In the above description, as a correspondence relation between the sense amplifier unit SAU and the bit line BL, a case where one bit line BL is connected to one sense amplifier unit SAU has been described by way of an example, but the present disclosure is not limited thereto. For example, the sense amplifier module 12 may be configured such that the sense amplifier module 12 is provided with a selector that selectively connects a sense amplifier unit SAU to a bit line BL, and a plurality of bit lines BL are connected to one sense amplifier unit SAU via the selector.

[1-2] Operation of Memory System 1

Next, the operation of the memory system 1 will be described. The memory system 1 according to the exemplary embodiment executes dummy read immediately after power is turned ON and Power On Reset is executed.

The Power On Reset is an operation in which the semiconductor storage device 10 restores initial settings stored in the memory cell array 11 immediately after the memory system 1 is powered ON. Specifically, the Power On Reset includes, for example, an operation of reading initial setting parameters from the ROM area of the semiconductor storage device 10, or an operation of holding the read parameters in a corresponding register or the like in the semiconductor storage device 10.

The dummy read is an operation in which output of read data to the controller 20 is omitted while otherwise carrying out a normal read operation. In the operation of the memory system 1 according to the exemplary embodiment, a read operation in the SLC method is applied to the dummy read.

Figure 7:
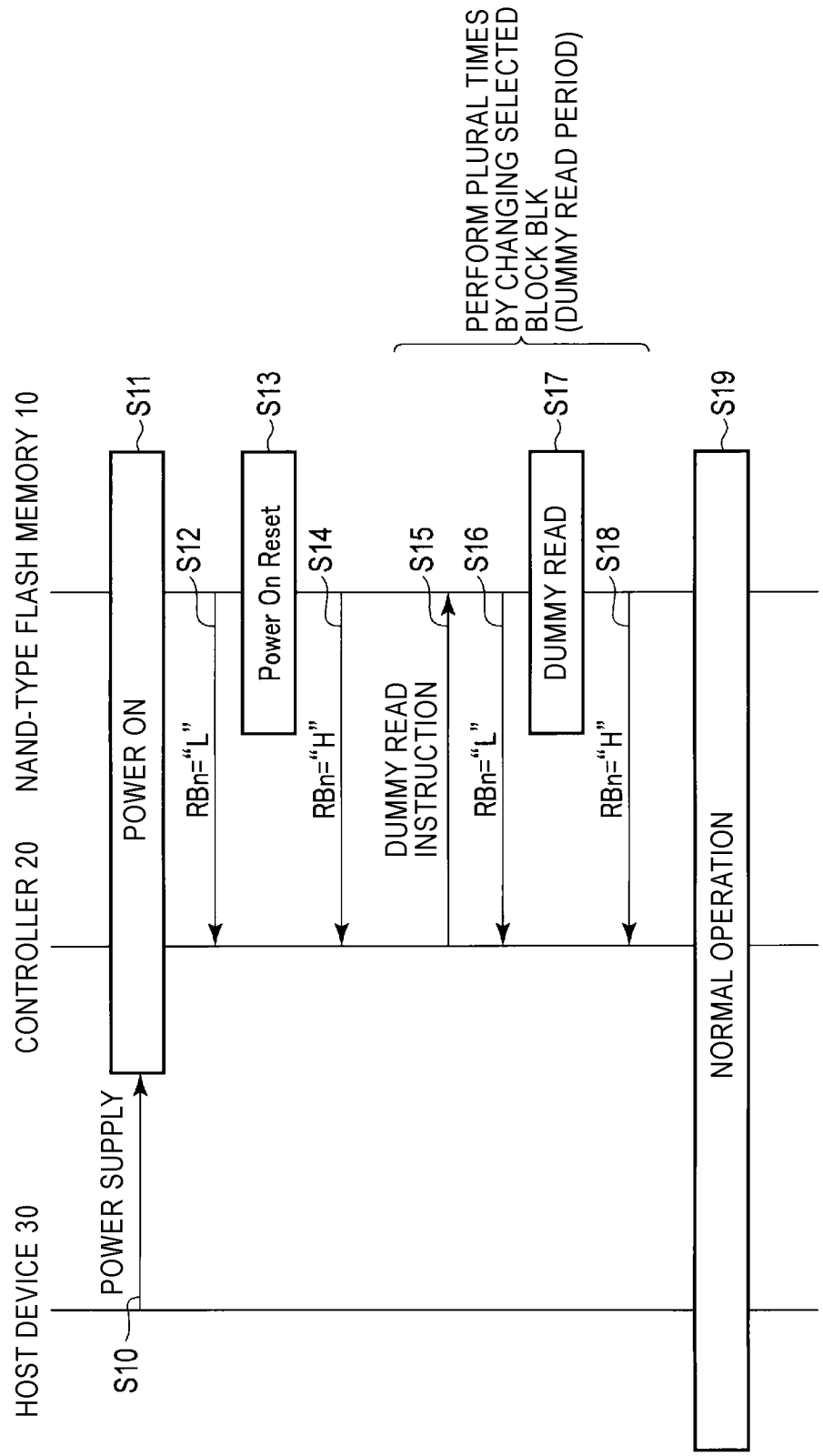
FIG. 7 is an operation flow chart in the memory system according to the first exemplary embodiment.

Hereinafter, the detailed operation of the memory system 1 before and after the power is turned ON will be described with reference to FIG. 7. FIG. 7 illustrates an operation flow chart of the memory system 1.

As illustrated in FIG. 7, first, the host device 30 supplies power to the memory system 1 (which includes the semiconductor storage device 10 and the controller 20) (step S10). Then, the memory system 1 is powered ON (step S11). The powered-ON semiconductor storage device 10 maintains a ready/busy signal RBn at an "L" level immediately after the powering-ON (step S12), and executes Power On Reset (step S13). Then, when the initial setting of the semiconductor storage device 10 is completed after the completion of the Power On Reset, the semiconductor storage device 10 sets the ready/busy signal RBn to an "H" level (step S14).

When detecting that the ready/busy signal RBn is set to the "H" level after the memory system 1 is turned ON, the controller 20 instructs the semiconductor storage device 10 to perform dummy read (step S15). Then, the semiconductor storage device 10 instructed to perform the dummy read from the controller 20 sets the ready/busy signal RBn to the "L" level (step S16), and executes the dummy read in which one block BLK is selected (step S17).

Figure 8:
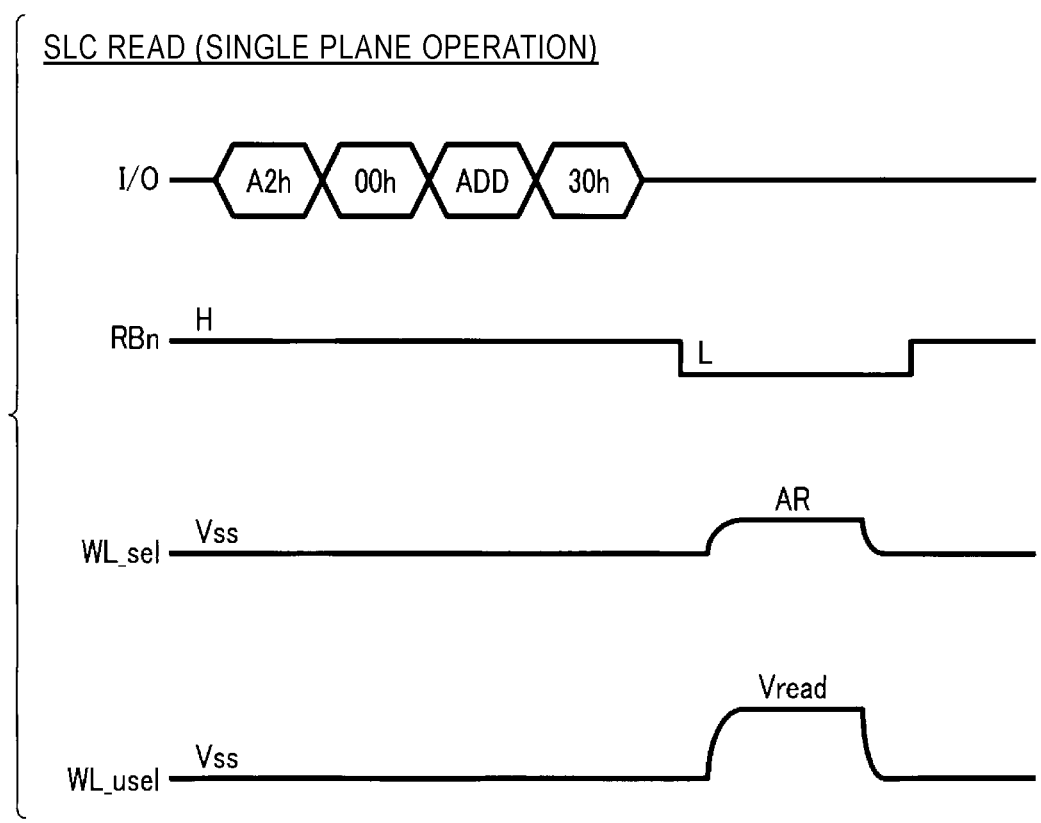
FIG. 8 is a view illustrating a command sequence and waveforms of dummy read in the memory system according to the first exemplary embodiment.

Here, in the exemplary embodiment, a command by which the controller 20 instructs the semiconductor storage device 10 to perform dummy read and a voltage applied to a word line WL in the dummy read will be described in detail with reference to FIG. 8. FIG. 8 illustrates operations of an input signal I/O, a ready/busy signal RBn, and word lines WL in the dummy read. In the following description, a selected word line WL will be referred to as a selected word line WL_sel, and an unselected word line WL will be referred to as an unselected word line WL_usel.

As illustrated in FIG. 8, first, the controller 20 issues a command "A2h" and transmits the command "A2h" to the semiconductor storage device 10, and the semiconductor storage device 10 holds the received command "A2h" in the command register 15C. The command "A2h" is a command for instructing an operation in the SLC method. Next, the controller 20 issues a command "00h" and transmits the command "00h" to the semiconductor storage device 10, and the semiconductor storage device 10 holds the received command "00h" in the command register 15C. The command "00h" corresponds to an address input reception command for reading, and is a command that commands the semiconductor storage device 10 to read data. Next, the controller 20 transmits address information ADD to the semiconductor storage device 10, and the semiconductor storage device 10 holds the received address information ADD in the address register 15B. The address information ADD designates an address of a target to be read out. Next, the controller 20 transmits a command "30h" to the semiconductor storage device 10, and the semiconductor storage device 10 holds the received command "30h" in the command register 15C. The command "30h" is a command that causes the semiconductor storage device 10 to execute reading of data based on the command CMD and the address information ADD which have been transmitted immediately before. The command set for instructing the dummy read described above (step S15) is the same as a command set for instructing a read operation in the SLC method. That is, in the dummy read according to the exemplary embodiment, the operation of the semiconductor storage device 10 is the same as the read operation in the SLC method.

Then, when the command "30h" is stored in the command register 15C, the sequencer 17 of the semiconductor storage device 10 sets the ready/busy signal RBn from the "H" level to the "L" level (step S16), and executes the dummy read (the read operation in the SLC method) based on the command CMD and the address information ADD stored in the register 15 (step S17).

Specifically, in the dummy read, the row decoder 13 applies a read voltage AR to a selected word line WL_sel, and a voltage Vread to an unselected word line WL_usel. As the word line WL selected at this time, for example, the uppermost word line WL (WL7) in the corresponding block BLK is selected. The word line WL selected in the read operation is not limited thereto, but other word lines WL may be selected. Then, when the sense amplifier SA of each sense amplifier unit SAU determines read data, the data are transmitted to any one of latch circuits within the sense amplifier unit SAU. When the read data are transmitted to the latch circuit, the sequencer 17 sets the ready/busy signal RBn to the "H" level (step S18).

Referring back to FIG. 7, when detecting that the ready/busy signal is set from the "L" level to the "H" level after instructing the dummy read, the controller 20 does not instruct the semiconductor storage device 10 to output the read data and instead proceeds to the next operation. By contrast, in a normal read operation, after read data are determined, the controller 20 instructs the semiconductor storage device 10 to output the read data by toggling the read enable signal RE. Meanwhile, in the dummy read, this operation is omitted. That is, in the dummy read, the semiconductor storage device 10 executes the same read operation as the normal read operation, but does not output the read data to the controller 20.

The above described operations in steps S15 to S18 are executed plural times by changing the selected block BLK. For example, the controller 20 repeats the same instructions for the semiconductor storage device 10 until the dummy read operations are executed for all blocks BLK. In the following description, the period during which the operations in steps S15 to S18 are repeated will be referred to as a dummy read period.

When the dummy read operations for desired blocks BLK are completed by repeating operations in steps S15 to S18, the memory system 1 proceeds to a normal operation (step S19). In the normal operation, the memory system 1 performs operations according to instructions from the host device 30.

Figure 9:
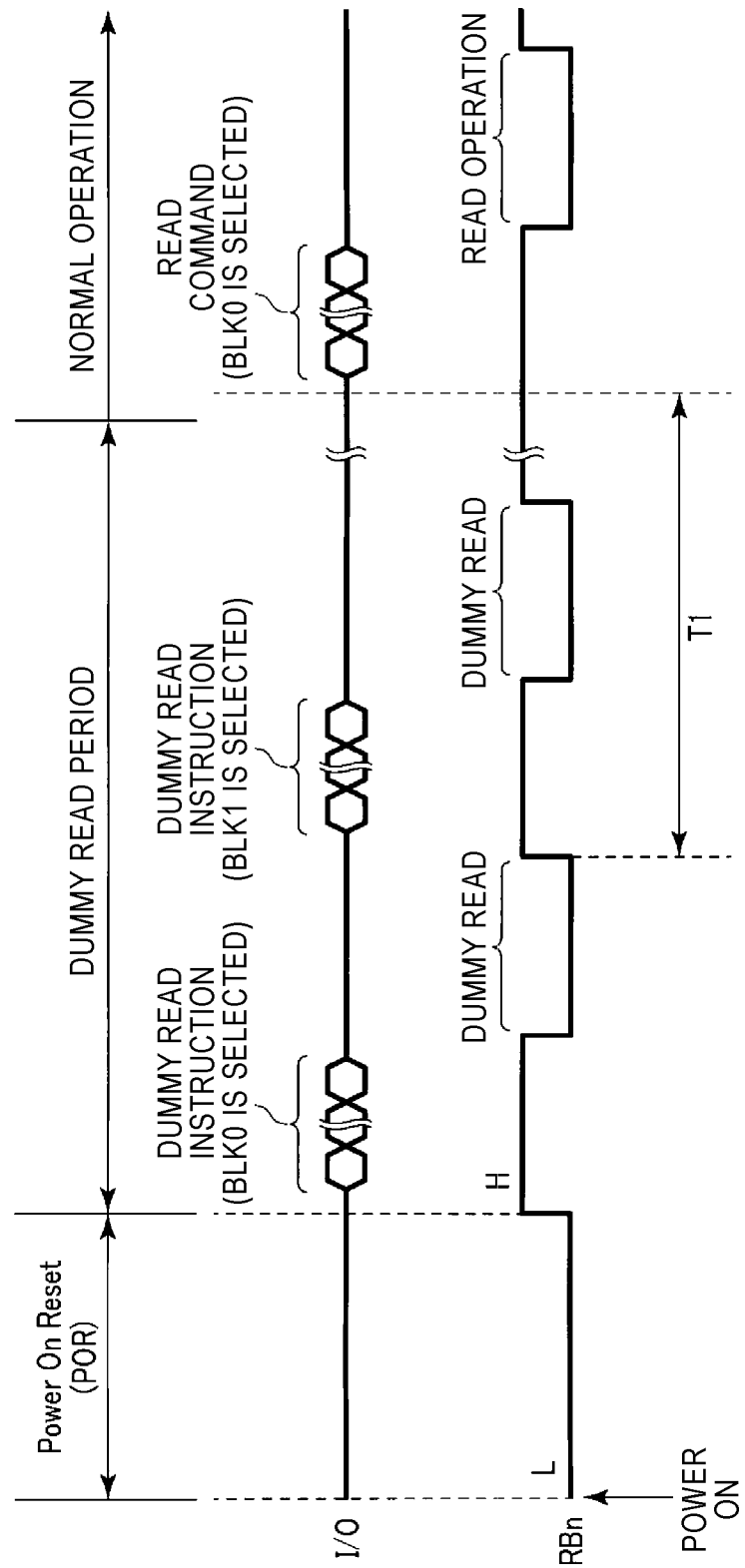
FIG. 9 is a view illustrating a command sequence and waveforms of operations in the memory system according to the first exemplary embodiment.

A specific example of the above described operation in FIG. 7 corresponds to FIG. 9. FIG. 9 illustrates detailed operations of the input signal I/O and the ready/busy signal RBn before and after the memory system 1 is powered ON.

As illustrated in FIG. 9, during a period in which the Power On Reset (POR) of the semiconductor storage device 10 is being executed after the memory system 1 is powered ON, the ready/busy signal RBn maintains the "L" level. In this period, no signal exchange is performed by, for example, the input/output signal I/O between the semiconductor storage device 10 and the controller 20. The handling of the input/output signal I/O in the period in which the POR is being executed is not limited thereto, but a signal exchange may be performed by the input/output signal I/O in the period.

In the dummy read period after the POR is completed, the controller 20 instructs, for example, the semiconductor storage device 10 to perform the dummy read in which a block BLK0 is selected. When the dummy read in which the block BLK0 is selected is completed, the controller 20 instructs the semiconductor storage device 10 to perform the dummy read in which a block BLK1 is selected. Similarly, a predetermined block BLK is selected and the dummy read is executed.

After the dummy read period ends, when the memory system 1 is placed in a normal operation state, and a read operation on, for example, the block BLK0 is executed, the controller 20 controls the semiconductor storage device 10 not to execute the read operation on the block BLK0 until time T1 elapses from the completion of the dummy read on the block BLK0. That is, when executing a read operation on a certain block BLK, the controller 20 counts the time from the execution of the dummy read on the corresponding block BLK by the timer 26, and executes the read operation after the timer count exceeds a predetermined time (e.g., 100 ms). The method of setting the time T1 is not limited as described herein and other time period may be set.

[1-3] Effect of First Exemplary Embodiment

According to the above described memory system 1 according to the first exemplary embodiment, the reliability of the read operation may be improved. Hereinafter, the effect will be described in detail.

Figure 10:
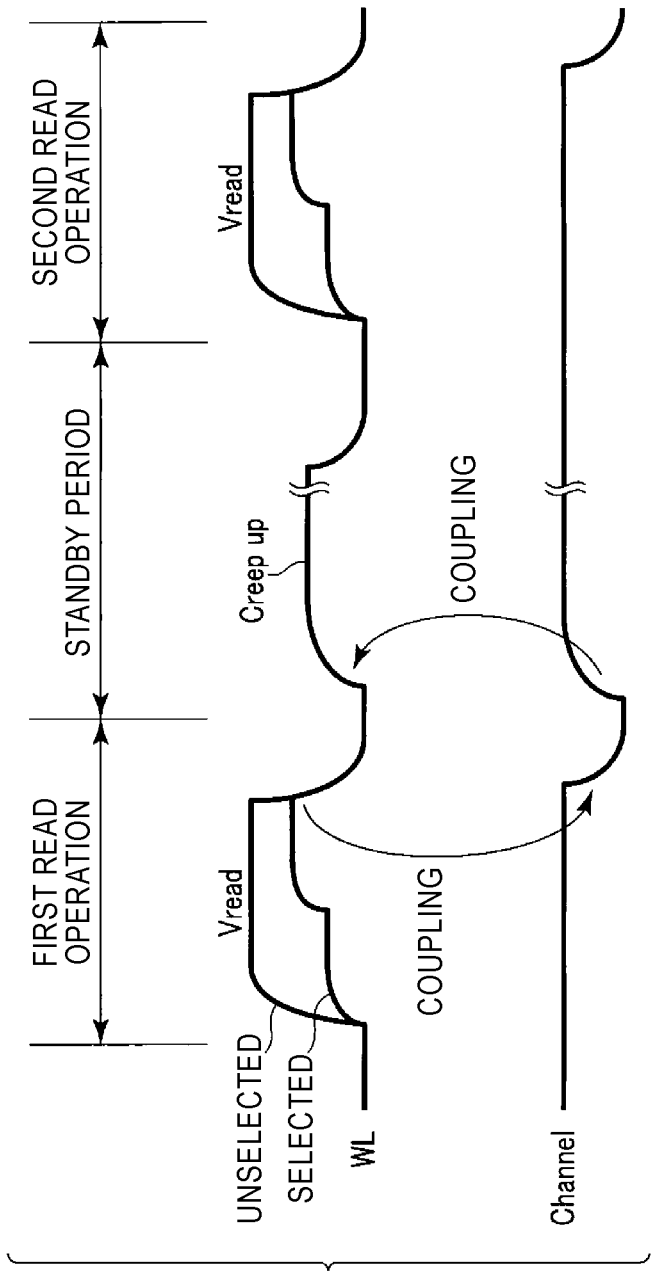
FIG. 10 is a view illustrating a creep-up phenomenon after various operations of the semiconductor storage device.

In a semiconductor storage device, a channel of memory cell transistors MT constituting a NAND string NS has a structure in which, for example, a conductive semiconductor material 50 is shared as illustrated in FIG. 5. In the semiconductor storage device 10 having such a structure, a phenomenon illustrated in FIG. 10 may occur. FIG. 10 illustrates an example of waveforms of a word line WL and a channel of a NAND string NS in various operations. Specifically, FIG. 10 illustrates an example of waveforms in operations in which read operations of the first time and the second time in which a certain block BLK is selected are executed and a standby period exists between the first read operation and the second read operation. In the first and second read operations illustrated in FIG. 10, a waveform in the case where a read voltage is stepped up once is illustrated as an example.

As illustrated in FIG. 10, in the first read operation, the row decoder 13 applies a read voltage and a read pass voltage to selected and unselected word lines WL of a selected block BLK, respectively. Then, when the first read operation is completed, the row decoder 13 decreases the voltage of the word line WL. When the voltage of the word line WL becomes equal to or lower than a threshold voltage of the memory cell transistor MT, the memory cell transistor MT is turned OFF. When the voltage of the word line WL decreases, the channel potential of the NAND string NS drops from a ground voltage to a negative voltage due to coupling with the word line WL. After the first read operation, the word line WL is made unselected and is placed in a floating state, and the channel potential dropped to the negative voltage is returned to the ground voltage with the lapse of time. Here, the voltage of the word line WL rises due to the coupling with the channel of the NAND string NS. This phenomenon is referred to herein as "creep up" in FIG. 10.

In this manner, in the block BLK in which the voltage of the word line WL rises by creep up, a potential difference may occur between the control gate and the channel of the memory cell transistor MT in the corresponding block BLK, and the threshold voltage may fluctuate. Specifically, it is considered that when the creep up occurs, electrons are trapped in a charge storage layer, and the threshold voltage rises in a memory cell transistor MT having a low threshold voltage, and electrons are moved from the charge storage layer to the word line WL side, and the threshold voltage drops in a memory cell transistor MT having a high threshold voltage.

Then, the voltage of the word line WL, which rises by the creep up, is returned to the ground voltage due to leakage from, for example, the junction of the word line WL with the lapse of time. When time further elapses after the fluctuation of the voltage of the word line WL by the creep up has settled, the threshold voltage of the memory cell, which has risen, is returned to its original state. In the following description, a state where the threshold voltage of the memory cell transistor MT is not affected by the creep up will be referred to as a first state, and a state where the threshold voltage of the memory cell transistor MT fluctuates under the influence of the creep up will be referred to as a second state. The read voltage set in consideration of this phenomenon is optimized to, for example, the first state or the second state.

However, depending on the time required for transition from the first state to the second state by various operations, and the time required for returning to the first state after the transition to the second state, the first read operation may be executed in the first state, and the second read operation may be executed in the second state. That is, when the read voltage optimized to any one of the first and second states is used, read results of the first and second read operations may be changed depending on the length of the standby period illustrated in FIG. 10.

Accordingly, the memory system 1 according to the exemplary embodiment executes the dummy read immediately after the memory system 1 is powered ON. The dummy read is a read operation that is not accompanied by output of read data, and is executed, for example, in block BLK units. In the dummy read, the row decoder 13 applies the same voltages as those of the normal read operation to selected and unselected word lines WL. Then, in the block BLK for which the dummy read is executed, creep up occurs as the dummy read ends, and the threshold voltage of the memory cell transistor MT fluctuates. That is, in the block BLK for which the dummy read is executed, the threshold voltage of the memory cell transistor MT shifts from the first state to the second state in the same manner as the case where the normal read operation is executed.

Accordingly, at the time when the memory system 1 is powered ON and starts an operation based on the command from the host device 30, the memory system 1 according to the exemplary embodiment is placed in a state where the threshold voltage of the memory cell transistor MT is shifted to the second state. That is, even when a block BLK for which a read operation has not been executed after the memory system 1 is powered ON, is selected, the memory system 1 may execute a read operation on the memory cell transistor MT in the second state. As a result, the semiconductor storage device 10 may optimize the read voltage to the second state, thereby suppressing the fluctuation in read results in a plurality of read operations on the same block BLK.

As described above, the memory system 1 according to the exemplary embodiment may suppress the fluctuation of the read results after the memory system 1 is powered ON. Thus, the reliability of the read operation can be improved.

The dummy read in the memory system 1 according to the exemplary embodiment is executed in response to the powering-ON of the memory system 1, and the completion of the Power On Reset of the semiconductor storage device 10. That is, the memory system 1 voluntarily executes the dummy read without receiving an instruction from the host device 30.

The voltage of the word line WL, which is reached by the creep up as described above, depends on the voltage applied to the word line WL during various operations. Specifically, the voltage of the word line WL, which is reached by the creep up, becomes higher as the voltage applied to the word line WL increases during various operations. Therefore, the voltage of the word line WL, which is reached by the creep up, is higher in the memory cell transistor MT corresponding to the unselected word line WL_usel to which the read pass voltage is applied, than in the memory cell transistor MT corresponding to the selected word line WL_sel to which the read voltage is applied in the dummy read. As a result, the fluctuation amount of the threshold voltage of the memory cell transistor MT in the block BLK for which the dummy read is executed is larger in the unselected memory cell transistor MT, than in the selected memory cell transistor MT.

The voltage of the word line WL, which is reached by the creep up, is also affected by a transistor adjacent to the memory cell transistor MT corresponding to the word line WL. For example, since the select transistor ST1 has a low threshold voltage and the voltage to be applied in the read operation is also low, the fluctuation in a channel potential is small after various operations. Thus, the fluctuation of the channel potential in the memory cell transistor MT adjacent to the select transistor ST1 (e.g., the memory cell transistor MT corresponding to the uppermost word line WL) is also suppressed, and the voltage rise by the creep up in the corresponding word line WL is also suppressed. As a result, in the memory cell transistor MT adjacent to the select transistor ST1, the fluctuation amount of the threshold voltage caused by the creep up becomes smaller than that in other memory cell transistors MT. In the memory cell transistor MT adjacent to the select transistor ST1, the dependence between the voltage value applied to the corresponding word line WL and the fluctuation amount of the threshold voltage of the memory cell transistor MT caused by the creep up is smaller than that in other memory cell transistors MT.

From the above description, the memory system 1 may execute the dummy read in which the word line WL corresponding to the memory cell transistor MT adjacent to the select transistor ST1 is selected. As described above, by selecting the memory cell transistor MT having a small difference between a change amount of the threshold voltage when the read voltage is applied to the corresponding word line WL, and a change amount of the threshold voltage when the read pass voltage is applied to the corresponding word line WL, it is possible to suppress the difference between a change amount of the threshold voltage distribution of the memory cell transistor selected in the block BLK for which the dummy read is executed and a change amount of the threshold voltage distribution of the unselected memory cell transistor. Accordingly, the memory system 1 can make the influence of the creep up in the corresponding block BLK as uniform as possible, and can improve the reliability of the read operation.

In the exemplary embodiment, the controller 20 operates such that a read operation on a certain block BLK is not executed until the time T1 elapses from the completion of the dummy read on the block BLK. The time T1 is set to the time until the state of the memory cell transistor MT of the block BLK for which the dummy read is executed shifts from the first state to the second state. Accordingly, the memory system 1 may avoid a read operation on the memory cell transistor MT during the fluctuation of the threshold voltage due to the creep up. That is, the memory system 1 may execute the read operation on the memory cell transistor MT that is stable in the second state. Accordingly, the memory system according to the exemplary embodiment may suppress the fluctuation of read data, and improve the reliability of the read operation.

In the exemplary embodiment, the case where the controller 20 instructs dummy read on each block BLK once in the dummy read period has been described as an example, but the present disclosure is not limited thereto. For example, the controller 20 may instruct plural times of dummy read on each block BLK. The controller 20 may change a word line WL to be selected in plural times of dummy read on the same block BLK.

[2] Second Exemplary Embodiment

Next, a memory system 1 according to a second exemplary embodiment will be described. In the exemplary embodiment, an MLC method is applied to the dummy read described in the first exemplary embodiment.

[2-1] Operation of Memory System 1

Figure 11:
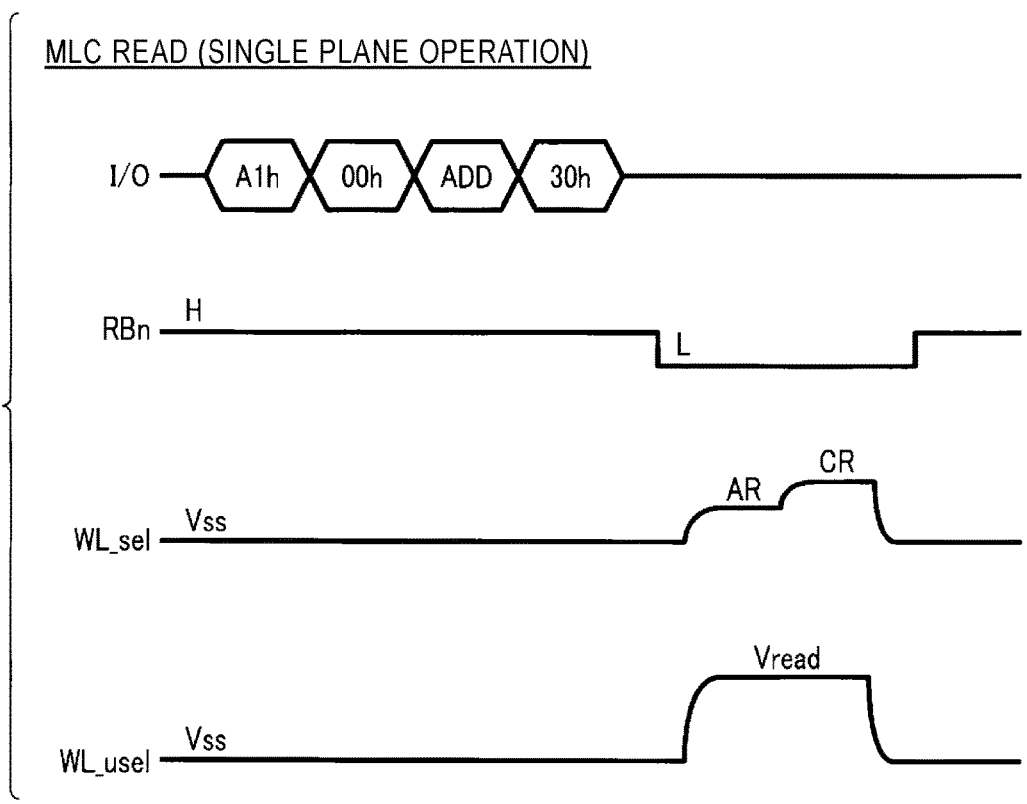
FIG. 11 is a view illustrating a command sequence and waveforms of dummy read in a memory system according to a second exemplary embodiment.

Hereinafter, the operation of the memory system 1 in the exemplary embodiment will be described with reference to FIG. 11. FIG. 11 illustrates operations of an input signal I/O, a ready/busy signal RBn, and a word line WL in the dummy read according to the exemplary embodiment. The operation of the memory system 1 in the exemplary embodiment is different from that in the first exemplary embodiment, in terms of a command set for instructing the dummy read and a voltage applied to a word line WL.

Specifically, as illustrated in FIG. 11, the command set by which the controller 20 instructs the semiconductor storage device 10 in the exemplary embodiment is the same as the command set described in the first exemplary embodiment with reference to FIG. 8, except that the command "A2h" is replaced by a command "A1h." The command "A1h" is a command for instructing an operation in the MLC method. The command set illustrated in FIG. 11 is the same as a command set for instructing a read operation in the MLC method. That is, in the dummy read in the exemplary embodiment, the operation of the semiconductor storage device 10 is the same as the read operation in the MLC method.

Then, when a command "30h" is stored in the command register 15C, the sequencer 17 of the semiconductor storage device 10 sets the ready/busy signal RBn from a "H" level to a "L" level, and executes the dummy read (the read operation in the MLC method) based on the command CMD and the address information ADD stored in the register 15.

Specifically, in the dummy read, the row decoder 13 sequentially applies, for example, read voltages AR and CR to a selected word line WL_sel, and applies a voltage Vread to an unselected word line WL_usel. The read voltage applied to the selected word line WL_sel in the read operation in the exemplary embodiment is not limited thereto. The read voltage used in this operation is set based on, for example, the allocation of data to the threshold voltage of the memory cell transistor MT or a bit level to be read. Since the other operations are the same as those described in the first exemplary embodiment with reference to FIGS. 7 to 9, descriptions thereof will be omitted.

[2-2] Effect of Second Exemplary Embodiment

As described above, the memory system 1 according to the exemplary embodiment may execute the same operation as that of the first exemplary embodiment by applying the MLC method to the dummy read. Accordingly, the semiconductor storage device 10 according to the exemplary embodiment may improve the reliability of the read operation as in the first exemplary embodiment.

When 2-bit data are stored in one memory cell transistor MT, in the memory system 1 according to the present exemplary embodiment, the voltage applied by the dummy read and the voltage applied by a normal read operation may be made the same. That is, the memory system 1 may suppress the difference between a second state shifted by the dummy read and a second state shifted by the normal read operation. As described above, the memory system 1 according to the exemplary embodiment may execute the dummy read corresponding to the number of bits of data stored in the memory cell transistor MT, thereby suppressing a fluctuation of the threshold voltage due to creep up. Thus, it is possible to improve the reliability of the read operation.

In the memory system 1 according to the present exemplary embodiment, since the MLC method is applied to the dummy read, the read pass voltage Vread may be set higher than that in the dummy read in the first exemplary embodiment. In this case, in the memory system 1, the voltage of the word line WL, which is reached by the creep up, becomes higher than that in the first exemplary embodiment. Thus, the speed at which electrons are trapped in the charge storage layer of the memory cell transistor MT by the creep up becomes faster than that in the first exemplary embodiment. That is, in the memory system 1 according to the exemplary embodiment, the time until the memory cell transistor MT shifts to the second state after the completion of the dummy read may be made shorter than that in the first exemplary embodiment.

[3] Third Exemplary Embodiment

Next, the memory system 1 according to the third exemplary embodiment will be described. In the exemplary embodiment, the TLC method is applied to the dummy read described in the first exemplary embodiment.

[3-1] Operation of Memory System 1

Figure 12:
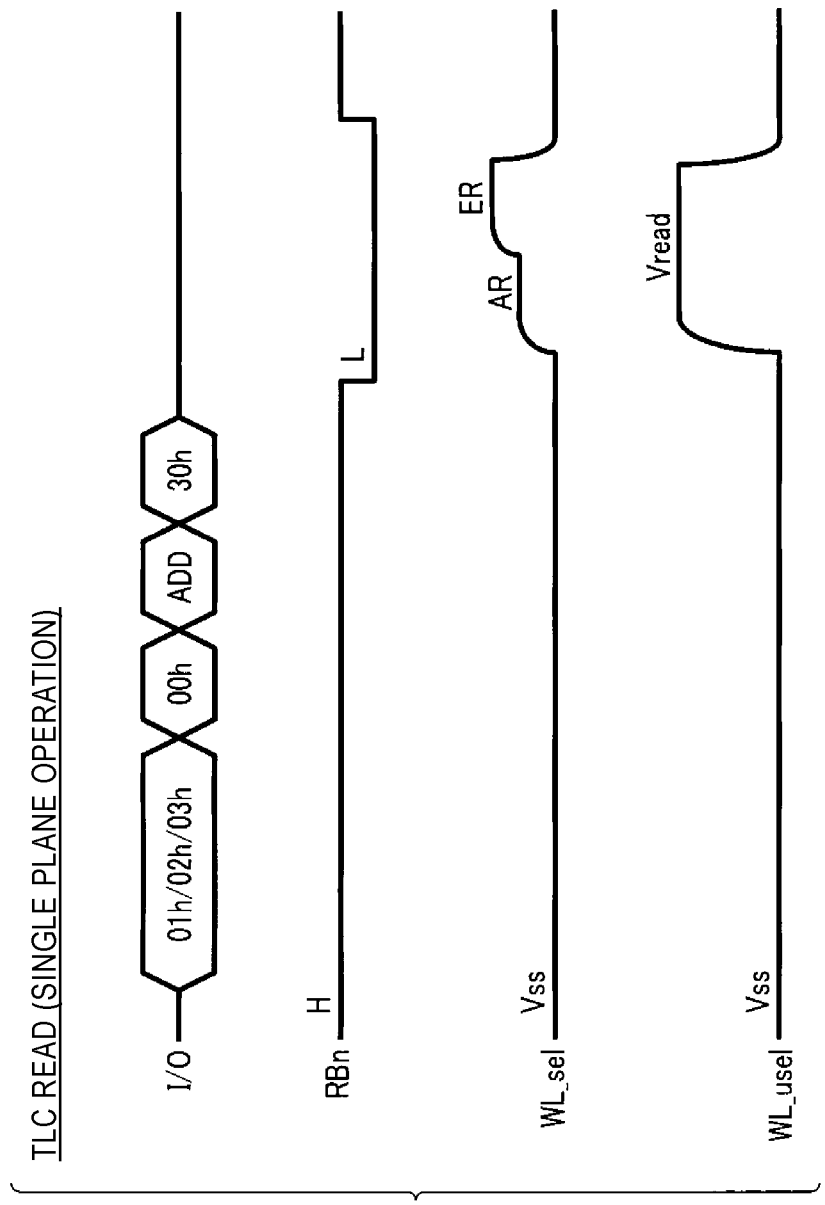
FIG. 12 is a view illustrating a command sequence and waveforms of dummy read in a memory system according to a third exemplary embodiment.

Hereinafter, the operation of the memory system 1 in the present exemplary embodiment will be described with reference to FIG. 12. FIG. 12 illustrates operations of an input signal I/O, a ready/busy signal RBn, and a word line WL in the dummy read according to the present exemplary embodiment. The operation of the memory system 1 in the exemplary embodiment is different from that in the first exemplary embodiment, in terms of a command set for instructing the dummy read and a voltage applied to a word line WL.

Specifically, as illustrated in FIG. 12, the command set by which the controller 20 instructs the semiconductor storage device 10 in the present exemplary embodiment is the same as the command set described in the first exemplary embodiment with reference to FIG. 8, except that the command "A2h" is replaced by a command "01h/02h/03h." The command "01h/02h/03h" is a command for instructing an operation in the TLC method, and when any one of the commands is selected, a bit level to be read may be designated. The command set illustrated in FIG. 12 is the same as a command set for instructing a read operation in the TLC method. That is, in the dummy read in the exemplary embodiment, the operation of the semiconductor storage device 10 is the same as the read operation in the TLC method.

Then, when a command "30h" is stored in the command register 15C, the sequencer 17 of the semiconductor storage device 10 sets the ready/busy signal RBn from a "H" level to a "L" level, and executes the dummy read (the read operation in the TLC method) based on the command CMD and the address information ADD stored in the register 15.

Specifically, in the dummy read, the row decoder 13 sequentially applies, for example, read voltages AR and ER to a selected word line WL_sel, and applies a voltage Vread to an unselected word line WL_usel. The read voltage applied to the selected word line WL_sel in the read operation in the exemplary embodiment is not limited thereto. The read voltage used in this operation is set based on, for example, the allocation of data to the threshold voltage of the memory cell transistor MT or a bit level to be read. Other operations are the same as the dummy read described in the first exemplary embodiment with reference to FIG. 8, and descriptions thereof will be omitted.

[3-2] Effect of Third Exemplary Embodiment

As described above, the memory system 1 according to the exemplary embodiment may execute the same operation as that of the first exemplary embodiment by applying the TLC method to the dummy read. Accordingly, the semiconductor storage device 10 according to the exemplary embodiment may improve the reliability of a read operation as in the first exemplary embodiment.

When 3-bit data are stored in one memory cell transistor MT, the memory system 1 according to the exemplary embodiment may make the voltage applied by the dummy read and the voltage applied by a normal read operation the same. That is, the memory system 1 may suppress the difference between a second state shifted by the dummy read, and a second state shifted by the normal read operation. As described above, the memory system 1 according to the exemplary embodiment may execute the dummy read corresponding to the number of bits of data stored in the memory cell transistor MT, thereby suppressing the fluctuation of the threshold voltage due to creep up. Thus, it is possible to improve the reliability of the read operation.

In the memory system 1 according to the exemplary embodiment, the TLC method is applied to the dummy read. Thus, the read pass voltage Vread may be set higher than those in the dummy read in the first and second exemplary embodiments. In this case, in the memory system 1, the voltage of the word line WL, which is reached by the creep up, becomes higher than those in the first and second exemplary embodiments. Thus, the speed at which electrons are trapped in the charge storage layer of the memory cell transistor MT by the creep up becomes faster than those in the first and second exemplary embodiments. That is, in the memory system 1 according to the exemplary embodiment, the time until the memory cell transistor MT shifts to the second state after the completion of the dummy read may be made shorter than those in the first and second exemplary embodiments.

[4] Fourth Exemplary Embodiment

Next, the memory system 1 according to the fourth exemplary embodiment will be described. In the exemplary embodiment, the QLC method is applied to the dummy read described in the first exemplary embodiment.

[4-1] Operation of Memory System 1

Figure 13:
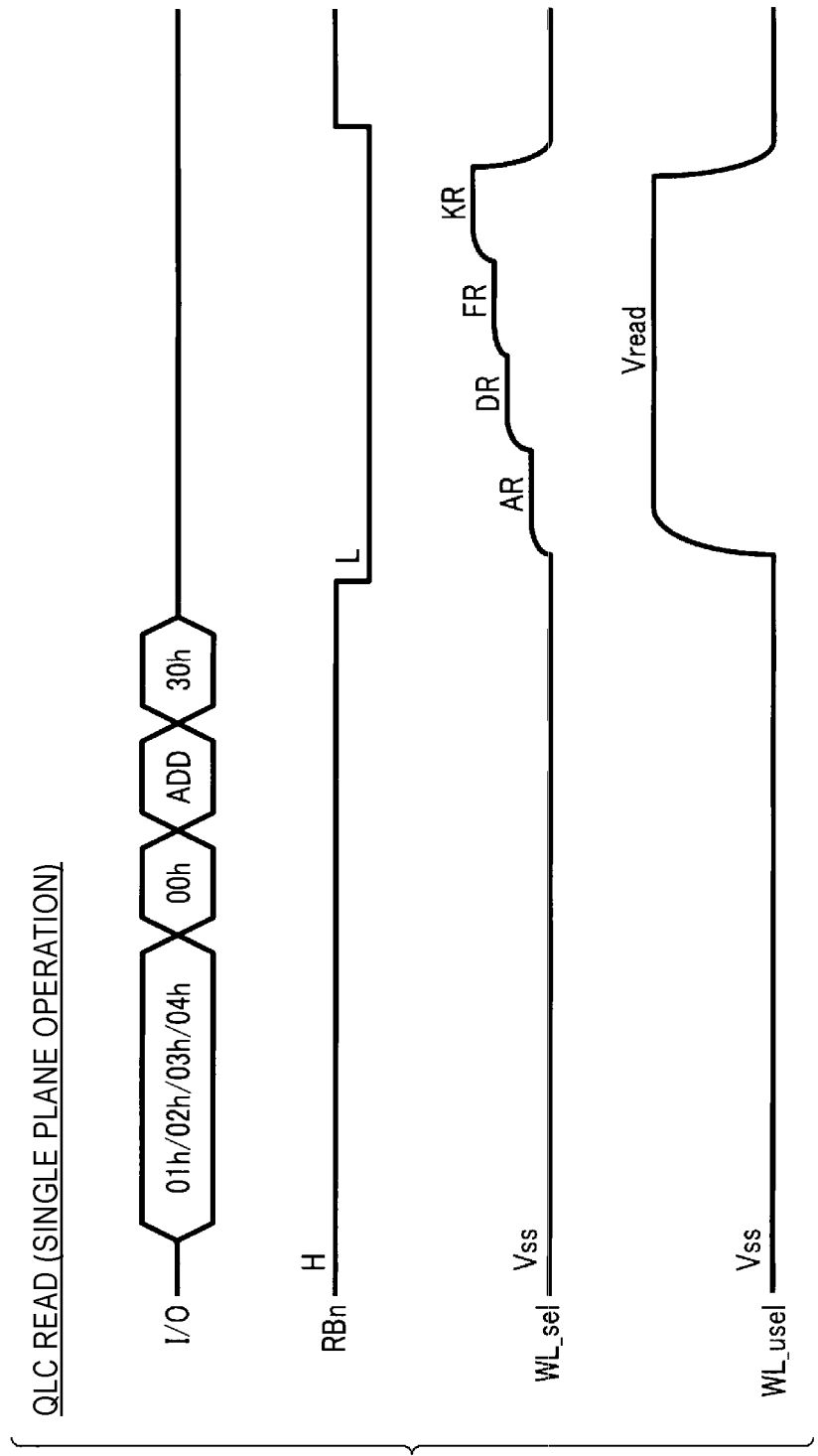
FIG. 13 is a view illustrating a command sequence and waveforms of dummy read in a memory system according to a fourth exemplary embodiment.

Hereinafter, the operation of the memory system 1 in the exemplary embodiment will be described with reference to FIG. 13. FIG. 13 illustrates operations of an input signal I/O, a ready/busy signal RBn, and a word line WL in the dummy read according to the present exemplary embodiment. The operation of the memory system 1 in the present exemplary embodiment is different from that in the first exemplary embodiment, in terms of a command set for instructing the dummy read and a voltage applied to a word line WL.

Specifically, as illustrated in FIG. 13, the command set by which the controller 20 instructs the semiconductor storage device 10 in the present exemplary embodiment is the same as the command set described in the first exemplary embodiment with reference to FIG. 8, except that the command "A2h" is replaced by a command "01h/02h/03h/04h." The command "01h/02h/03h/04h" is a command for instructing an operation in the QLC method, and when anyone of these commands is selected, a bit level to be read may be designated. The command set illustrated in FIG. 13 is the same as a command set for instructing a read operation in the QLC method. That is, in the dummy read in the present exemplary embodiment, the operation of the semiconductor storage device 10 is the same as the read operation in the QLC method.

Then, when a command "30h" is stored in the command register 15C, the sequencer 17 of the semiconductor storage device 10 sets the ready/busy signal RBn from a "H" level to a "L" level, and executes the dummy read (the read operation in the QLC method) based on the command CMD and the address information ADD stored in the register 15.

Specifically, in the dummy read, the row decoder 13 sequentially applies, for example, read voltages AR, DR, FR, and KR to a selected word line WL_sel, and applies a voltage Vread to an unselected word line WL_usel. The read voltage applied to the selected word line WL_sel in the read operation in the present exemplary embodiment is not limited thereto. The read voltage used in this operation is set based on, for example, the allocation of data to the threshold voltage of the memory cell transistor MT or a bit level to be read. Other operations are the same as the dummy read described in the first exemplary embodiment with reference to FIG. 8, and descriptions thereof will be omitted.

[4-2] Effect of Fourth Exemplary Embodiment

As described above, the memory system 1 according to the present exemplary embodiment may execute the same operation as that of the first exemplary embodiment by applying the QLC method to the dummy read. Accordingly, the semiconductor storage device 10 according to the exemplary embodiment may improve the reliability of a read operation as in the first exemplary embodiment.

When 4-bit data are stored in one memory cell transistor MT, the memory system 1 according to the exemplary embodiment may make the voltage applied by the dummy read and the voltage applied by a normal read operation the same. That is, the memory system 1 may suppress the difference between a second state shifted by the dummy read and a second state shifted by the normal read operation. As described above, the memory system 1 according to the exemplary embodiment may execute the dummy read corresponding to the number of bits of data stored in the memory cell transistor MT, thereby suppressing a fluctuation of the threshold voltage due to creep up. Thus, it is possible to improve the reliability of the read data.

In the memory system 1 according to the present exemplary embodiment, the QLC method is applied to the dummy read. Thus, the read pass voltage Vread may be set higher than those in the dummy read in the first to third exemplary embodiments. In this case, in the memory system 1, the voltage of the word line WL, which is reached by the creep up, becomes higher than those in the first to third exemplary embodiments. Thus, the speed at which electrons are trapped in the charge storage layer of the memory cell transistor MT by the creep up becomes faster than those in the first to third exemplary embodiments. That is, in the memory system 1 according to the present exemplary embodiment, the time until the memory cell transistor MT shifts to the second state after the completion of the dummy read may be made shorter than those in the first to third exemplary embodiments.

[5] Fifth Exemplary Embodiment

Next, the memory system 1 according to the fifth exemplary embodiment will be described. In the present exemplary embodiment, the semiconductor storage device 10 includes a plurality of planes, and executes the dummy read in the SLC method described in the first exemplary embodiment by a multi-plane operation.

[5-1] Configuration of Semiconductor Storage Device 10

Figure 14:
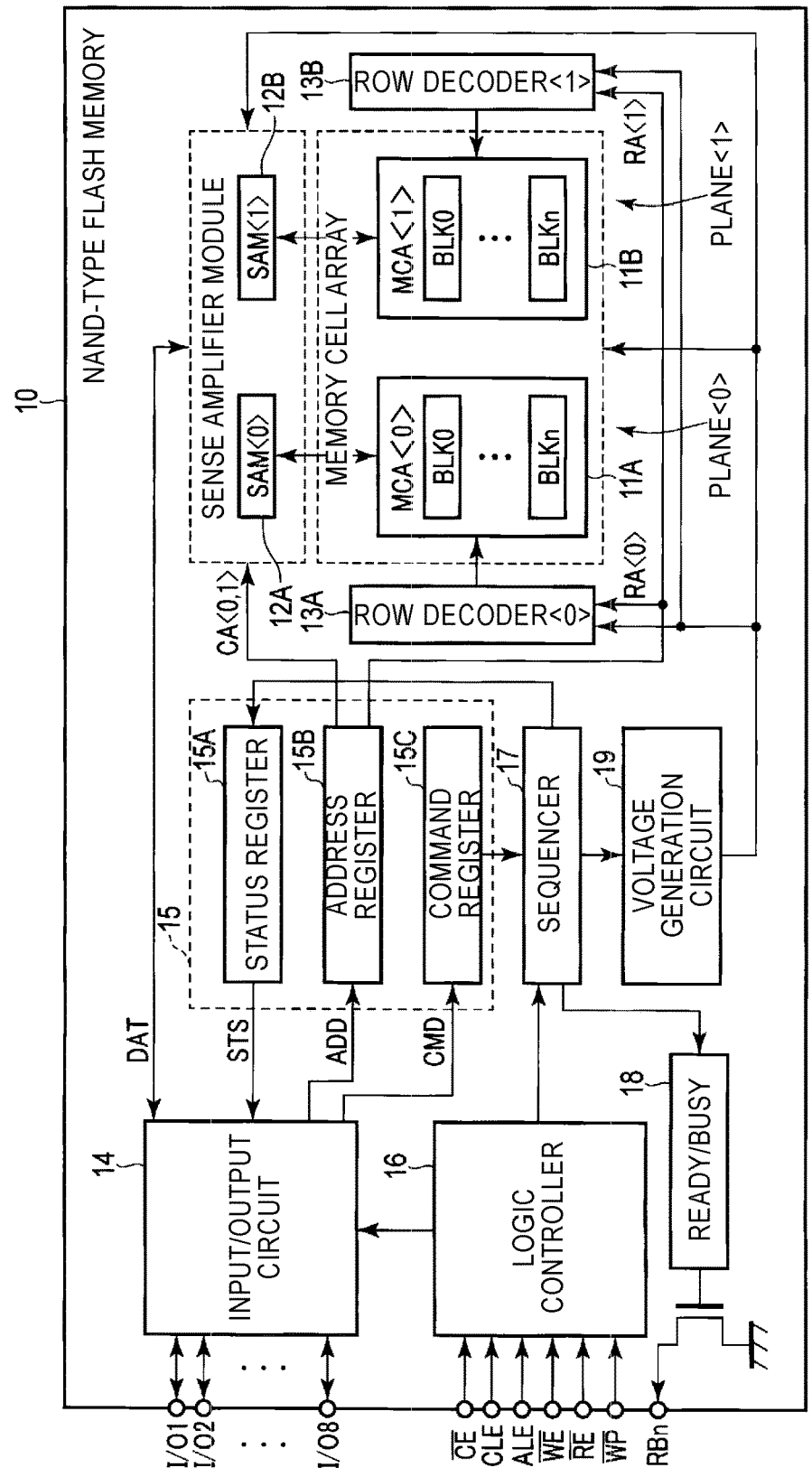
FIG. 14 is a block diagram of a memory system according to a fifth exemplary embodiment.

First, the configuration of the semiconductor storage device 10 in the exemplary embodiment will be described with reference to FIG. 14. FIG. 14 illustrates a block diagram of the semiconductor storage device 10 in the present exemplary embodiment. As illustrated in FIG. 14, the configuration of the semiconductor storage device 10 in the present exemplary embodiment is different from the configuration of the semiconductor storage device 10 described in the first exemplary embodiment with reference to FIG. 2, in that two planes are included.

Specifically, the semiconductor storage device 10 includes a plane <0> and a plane <1> which may be independently controlled. The plane <0> includes a memory cell array 11A, a sense amplifier module 12A, and a row decoder 13A, and the plane <1> includes a memory cell array 11B, a sense amplifier module 12B, and a row decoder 13B. As illustrated in FIG. 14, <0> is added to the end of an element corresponding to the plane <0>, and <1> is added to the end of an element corresponding to the plane <1>. Other configurations are the same as those in the semiconductor storage device 10 described in the first exemplary embodiment with reference to FIG. 2, and thus descriptions thereof will be omitted.

[5-2] Operation of Memory System 1

Next, the operation of the memory system 1 according to the exemplary embodiment will be described. The memory system 1 in the exemplary embodiment executes the dummy read in the SLC method described in the first exemplary embodiment with reference to FIG. 8, by the multi-plane operation.

Figure 15:
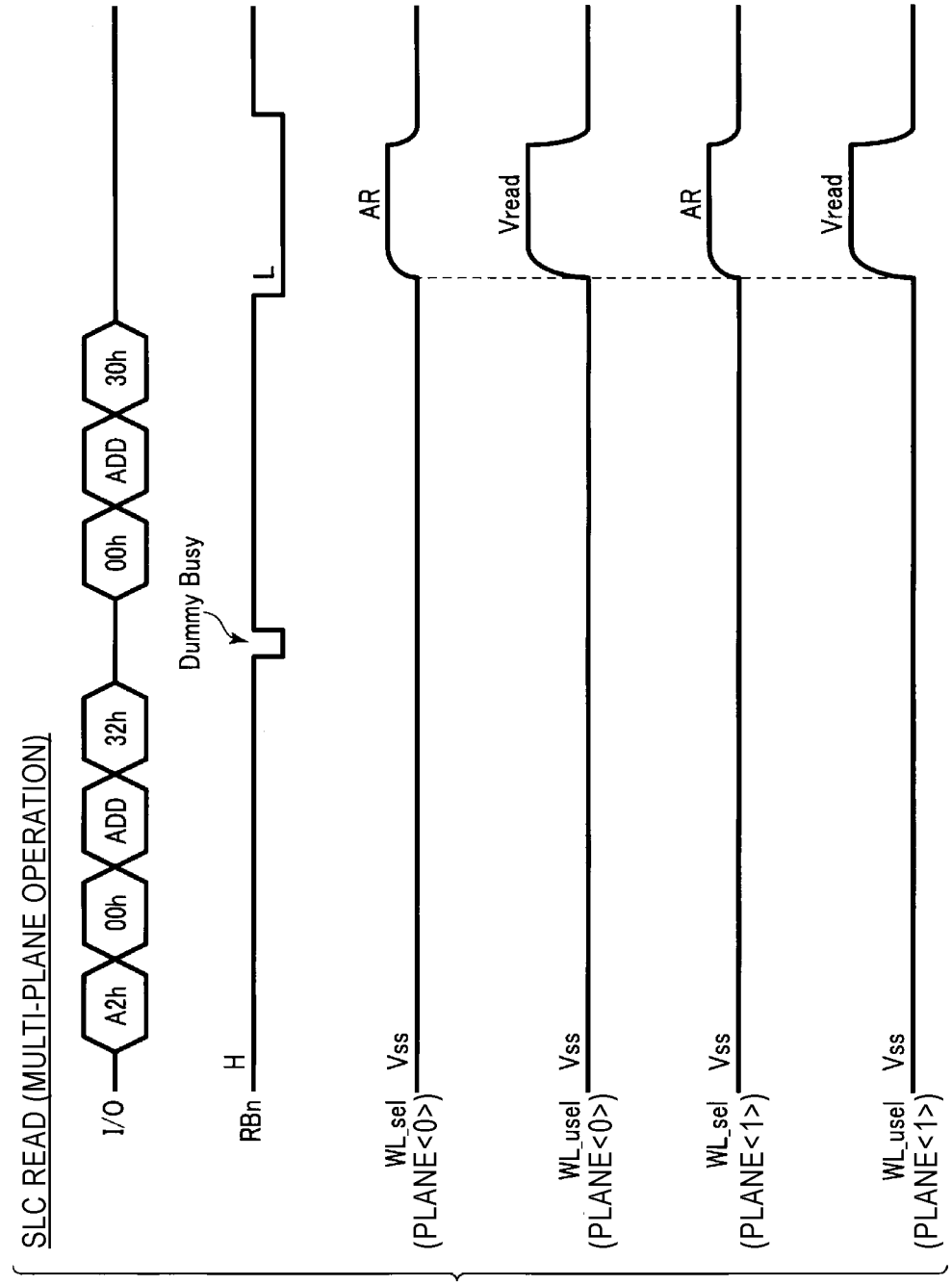
FIG. 15 is a view illustrating a command sequence and waveforms of dummy read in the memory system according to the fifth exemplary embodiment.

Hereinafter, a command sequence and waveforms of the dummy read in the present exemplary embodiment will be described with reference to FIG. 15. FIG. 15 illustrates operations of an input signal I/O, a ready/busy signal RBn and word lines WL corresponding to the planes <0> and <1> in the dummy read according to the present exemplary embodiment.

As illustrated in FIG. 15, first, the controller 20 sequentially transmits a command "A2h," a command "00h,"

address information ADD designating the plane <0>, and a command "32h" to the semiconductor storage device 10, and the semiconductor storage device 10 stores these commands in the command register 15C or the address register 15B. The command "32h" is a command used in the multi-plane operation, and indicates that the command CMD and the address information ADD transmitted till now correspond to one plane.

When the command "32h" is stored in the command register 15C, the sequencer 17 sets the ready/busy signal RBn from a "H" level to a "L" level, and subsequently, sets the ready/busy signal RBn from the "L" level to the "H" level. This operation informs the controller 20 that the semiconductor storage device 10 is capable of continuously receiving commands.

Subsequently, the controller 20 transmits a command set for instructing a read operation in the other plane, to the semiconductor storage device 10. Specifically, the controller 20 sequentially transmits a command "00h," address information ADD designating the plane <1>, and a command "30h" to the semiconductor storage device 10.

When the command "30h" is stored in the command register 15C, the sequencer 17 sets the ready/busy signal RBn from the "H" level to the "L" level, and executes the dummy read for the planes <0> and <1> based on the command set corresponding to the plane <0>, and the command set corresponding to the plane <1>. The waveforms of the selected and unselected word lines WL in the dummy read are the same as those in the read operation in the multi-plane operation to which the SLC method is applied. That is, the voltages applied to the selected and unselected word lines WL are the same as the voltages described in the first exemplary embodiment with reference to FIG. 8. Then, in the dummy read as illustrated in FIG. 15, the same voltages are applied in parallel to the selected and unselected word lines WL of the plane <0> and the selected and unselected word lines WL of the plane <1>. Other operations are the same as those described in the first exemplary embodiment with reference to FIGS. 7 to 9, and descriptions thereof will be omitted.

[5-3] Effect of Fifth Exemplary Embodiment

As described above, the memory system 1 according to the present exemplary embodiment may implement the same operation as that of the first exemplary embodiment by applying the multi-plane operation in the SLC method to the dummy read. Accordingly, the semiconductor storage device 10 according to the exemplary embodiment may improve the reliability of the read operation as in the first exemplary embodiment.

The memory system 1 according to the present exemplary embodiment may execute the dummy read operations in parallel for a plurality of planes. Thus, when the dummy read operations for the plurality of planes are required, the dummy read period may be shortened as compared to the case where the dummy read described in the first exemplary embodiment is applied.

[6] Sixth Exemplary Embodiment

Next, the memory system 1 according to the sixth exemplary embodiment will be described. In the exemplary embodiment, in the semiconductor storage device 10 including a plurality of planes as described in the fifth exemplary embodiment, the dummy read in the MLC method as described in the second exemplary embodiment is executed by a multi-plane operation.

[6-1] Operation of Memory System 1

Figure 16:
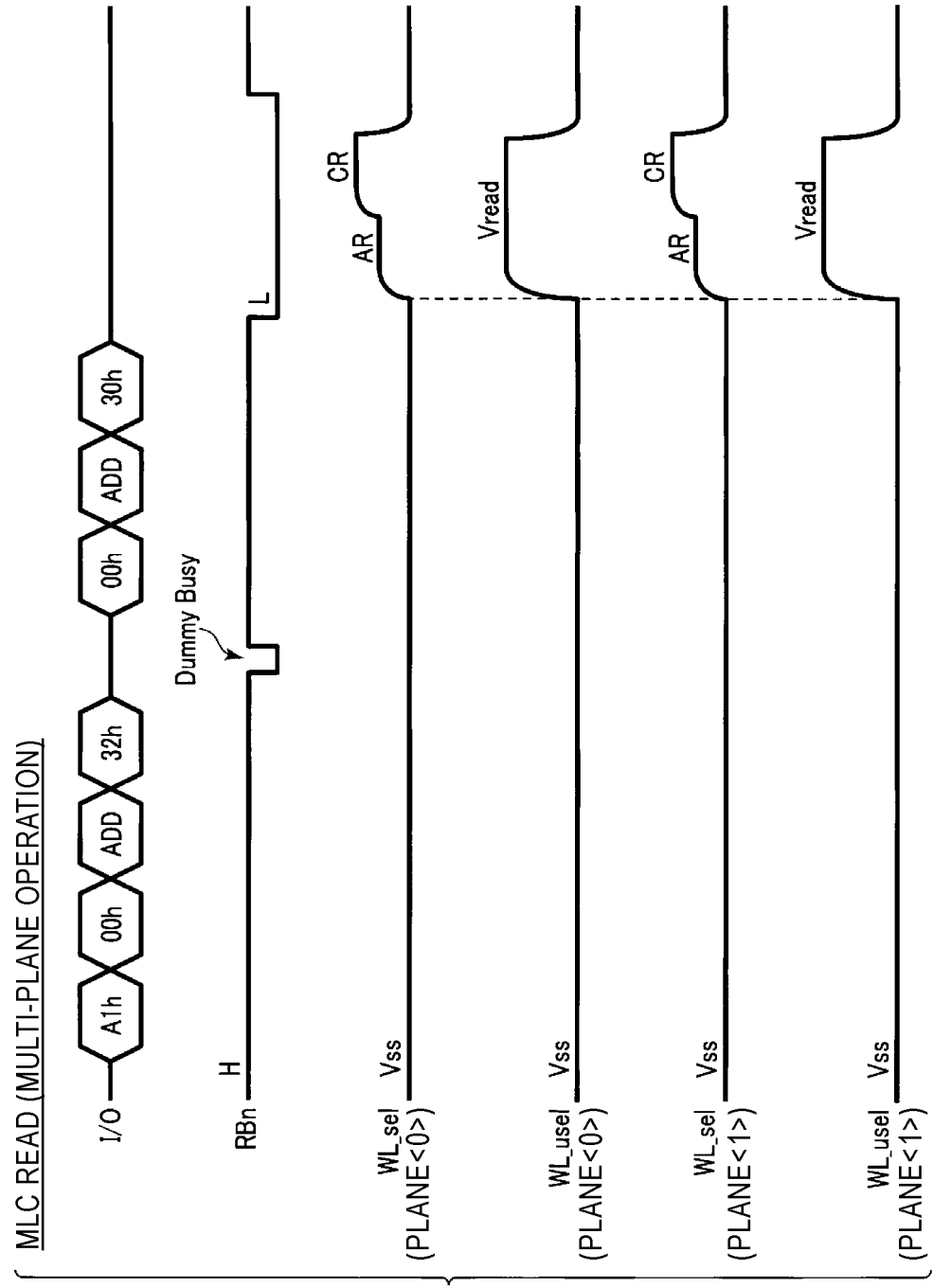
FIG. 16 is a view illustrating a command sequence and waveforms of dummy read in a memory system according to a sixth exemplary embodiment.

Next, the operation of the memory system 1 according to the present exemplary embodiment will be described with reference to FIG. 16. FIG. 16 illustrates operations of an input signal I/O, a ready/busy signal RBn, and word lines WL corresponding to the planes <0> and <1> in the dummy read according to the exemplary embodiment. As illustrated in FIG. 16, the operation of the memory system 1 in the exemplary embodiment is different from that in the fifth exemplary embodiment as illustrated in FIG. 15, in terms of a command set for instructing the dummy read and voltages applied to the word lines WL.

Specifically, as illustrated in FIG. 16, the command set by which the controller 20 instructs the semiconductor storage device 10 to perform the dummy read in the exemplary embodiment is the same as the command set described in the fifth exemplary embodiment with reference to FIG. 15, except that the command "A2h" is replaced by a command "A1h." The waveforms of voltages applied to the selected and unselected word lines WL by the row decoder 13 in the present exemplary embodiment are the same as those described in the second exemplary embodiment with reference to FIG. 11. Then, in the dummy read as illustrated in FIG. 16, the same voltages are applied in parallel to the selected and unselected word lines WL of the plane <0> and the selected and unselected word lines WL of the plane <1>. Other operations are the same as those described in the first exemplary embodiment with reference to FIGS. 7 to 9, and descriptions thereof will be omitted.

[6-2] Effect of Sixth Exemplary Embodiment

As described above, the memory system 1 according to the present exemplary embodiment may implement the same operation as that of the second exemplary embodiment by applying the multi-plane operation in the MLC method to the dummy read. Accordingly, the semiconductor storage device 10 according to the exemplary embodiment may improve the reliability of the read operation as in the second exemplary embodiment.

The memory system 1 according to the exemplary embodiment may execute the dummy read operations in parallel for a plurality of planes. Thus, when the dummy read operations for the plurality of planes are required, the dummy read period may be shortened compared to the case where the dummy read described in the second exemplary embodiment is applied.

[7] Seventh Exemplary Embodiment

Next, the memory system 1 according to the seventh exemplary embodiment will be described. In the exemplary embodiment, in the semiconductor storage device 10 including a plurality of planes as described in the fifth exemplary embodiment, the dummy read in the TLC method as described in the third exemplary embodiment is executed by a multi-plane operation.

[7-1] Operation of Memory System 1

Figure 17:
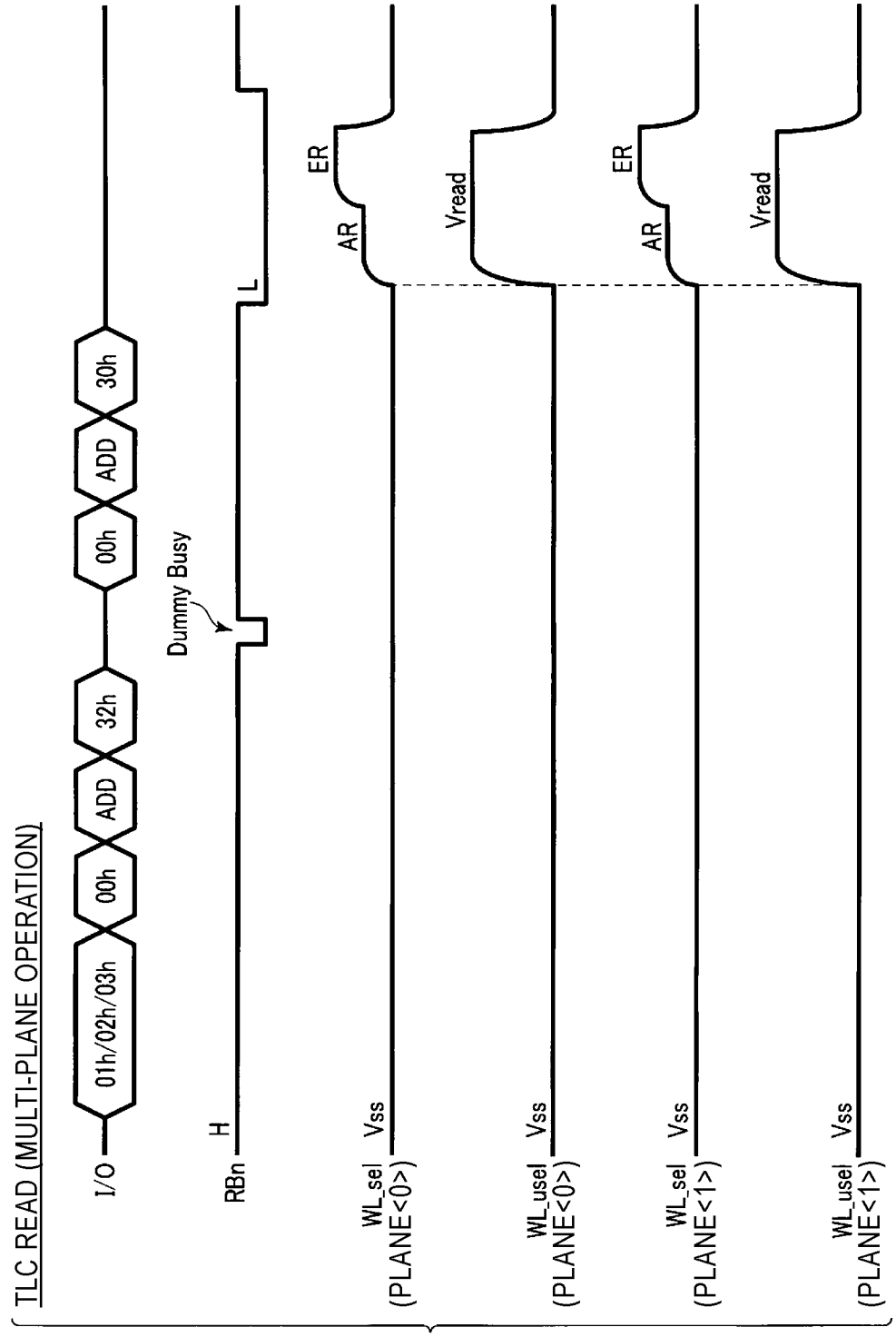
FIG. 17 is a view illustrating a command sequence and waveforms of dummy read in a memory system according to a seventh exemplary embodiment.

Next, the operation of the memory system 1 according to the exemplary embodiment will be described with reference to FIG. 17. FIG. 17 illustrates operations of an input signal I/O, a ready/busy signal RBn, and word lines WL corresponding to the planes <0> and <1> in the dummy read according to the present exemplary embodiment. As illustrated in FIG. 17, the operation of the memory system 1 in the present exemplary embodiment is different from that in the fifth exemplary embodiment as illustrated in FIG. 15, in terms of a command set for instructing the dummy read and voltages applied to the word lines WL.

Specifically, as illustrated in FIG. 17, the command set by which the controller 20 instructs the semiconductor storage device 10 to perform the dummy read in the present exemplary embodiment is the same as the command set described in the fifth exemplary embodiment with reference to FIG. 15, except that the command "A2h" is replaced by a command "01h/02h/03h." The waveforms of voltages applied to the selected and unselected word lines WL by the row decoder 13 in the exemplary embodiment are the same as those described in the third exemplary embodiment with reference to FIG. 12. Then, in the dummy read as illustrated in FIG. 17, the same voltages are applied in parallel to the selected and unselected word lines WL of the plane <0> and the selected and unselected word lines WL of the plane <1>. Other operations are the same as those described in the first exemplary embodiment with reference to FIGS. 7 to 9, and descriptions thereof will be omitted.

[7-2] Effect of Seventh Exemplary Embodiment

As described above, the memory system 1 according to the exemplary embodiment may implement the same operation as that of the third exemplary embodiment by applying the multi-plane operation in the TLC method to the dummy read. Accordingly, the semiconductor storage device 10 according to the present exemplary embodiment may improve the reliability of the read operation as in the third exemplary embodiment.

The memory system 1 according to the present exemplary embodiment may execute the dummy read operations in parallel for a plurality of planes. Thus, when the dummy read operations for the plurality of planes are required, the dummy read period may be shortened compared to the case where the dummy read described in the third exemplary embodiment is applied.

[8] Eighth Exemplary Embodiment

Next, the memory system 1 according to the eighth exemplary embodiment will be described. In the present exemplary embodiment, in the semiconductor storage device 10 including a plurality of planes as described in the fifth exemplary embodiment, the dummy read in the QLC method as described in the fourth exemplary embodiment is executed by a multi-plane operation.

[8-1] Operation of Memory System 1

Figure 18:
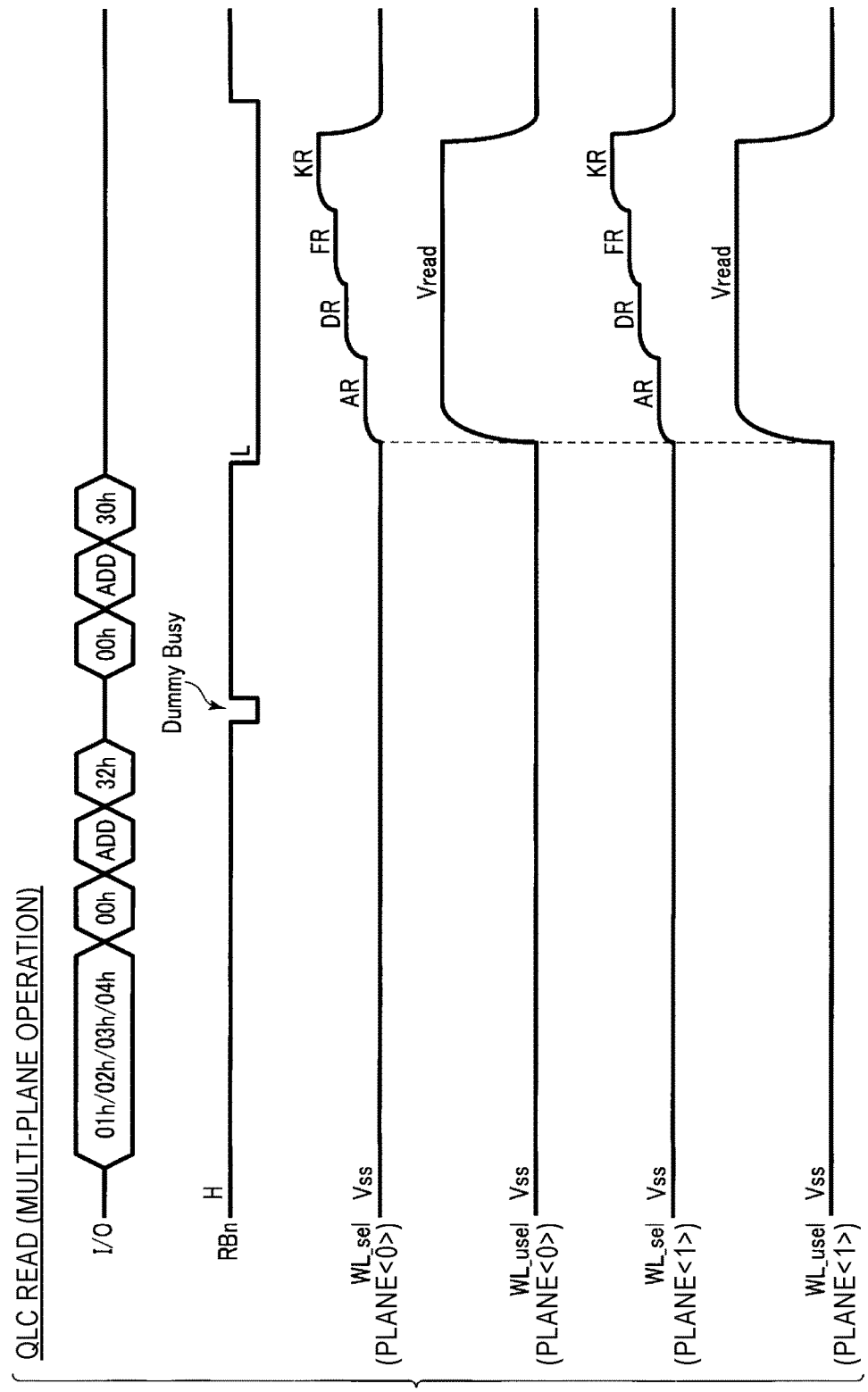
FIG. 18 is a view illustrating a command sequence and waveforms of dummy read in a memory system according to an eighth exemplary embodiment.

Next, the operation of the memory system 1 according to the present exemplary embodiment will be described with reference to FIG. 18. FIG. 18 illustrates operations of an input signal I/O, a ready/busy signal RBn and word lines WL corresponding to the planes <0> and <1> in the dummy read according to the present exemplary embodiment. As illustrated in FIG. 18, the operation of the memory system 1 in the present exemplary embodiment is different from that in the fifth exemplary embodiment as illustrated in FIG. 15, in terms of a command set for instructing the dummy read and voltages applied to the word lines WL.

Specifically, as illustrated in FIG. 18, the command set by which the controller 20 instructs the semiconductor storage device 10 to perform the dummy read in the present exemplary embodiment is the same as the command set described in the fifth exemplary embodiment with reference to FIG. 15, except that the command "A2h" is replaced by a command "01h/02h/03h/04h." The waveforms of voltages applied to the selected and unselected word lines WL by the row decoder 13 in the exemplary embodiment are the same as those described in the fourth exemplary embodiment with reference to FIG. 13. Then, in the dummy read as illustrated in FIG. 18, the same voltages are applied in parallel to the selected and unselected word lines WL of the plane <0> and the selected and unselected word lines WL of the plane <1>. Other operations are the same as those described in the first exemplary embodiment with reference to FIGS. 7 to 9, and descriptions thereof will be omitted.

[8-2] Effect of Eighth Exemplary Embodiment

As described above, the memory system 1 according to the present exemplary embodiment may implement the same operation as that of the fourth exemplary embodiment by applying the multi-plane operation in the QLC method to the dummy read. Accordingly, the semiconductor storage device 10 according to the present exemplary embodiment may improve the reliability of the read operation as in the fourth exemplary embodiment.

The memory system 1 according to the present exemplary embodiment may execute the dummy read operations in parallel for a plurality of planes. Thus, when the dummy read operations for the plurality of planes are required, the dummy read period may be shortened compared to the case where the dummy read described in the fourth exemplary embodiment is applied.

[9] Ninth Exemplary Embodiment

Next, the memory system 1 according to the ninth exemplary embodiment will be described. In the present exemplary embodiment, in the memory system 1 described in the first to eighth exemplary embodiments, the controller 20 periodically executes dummy read without receiving an instruction from the host device 30.

[9-1] Operation of Memory System 1

Figure 19:
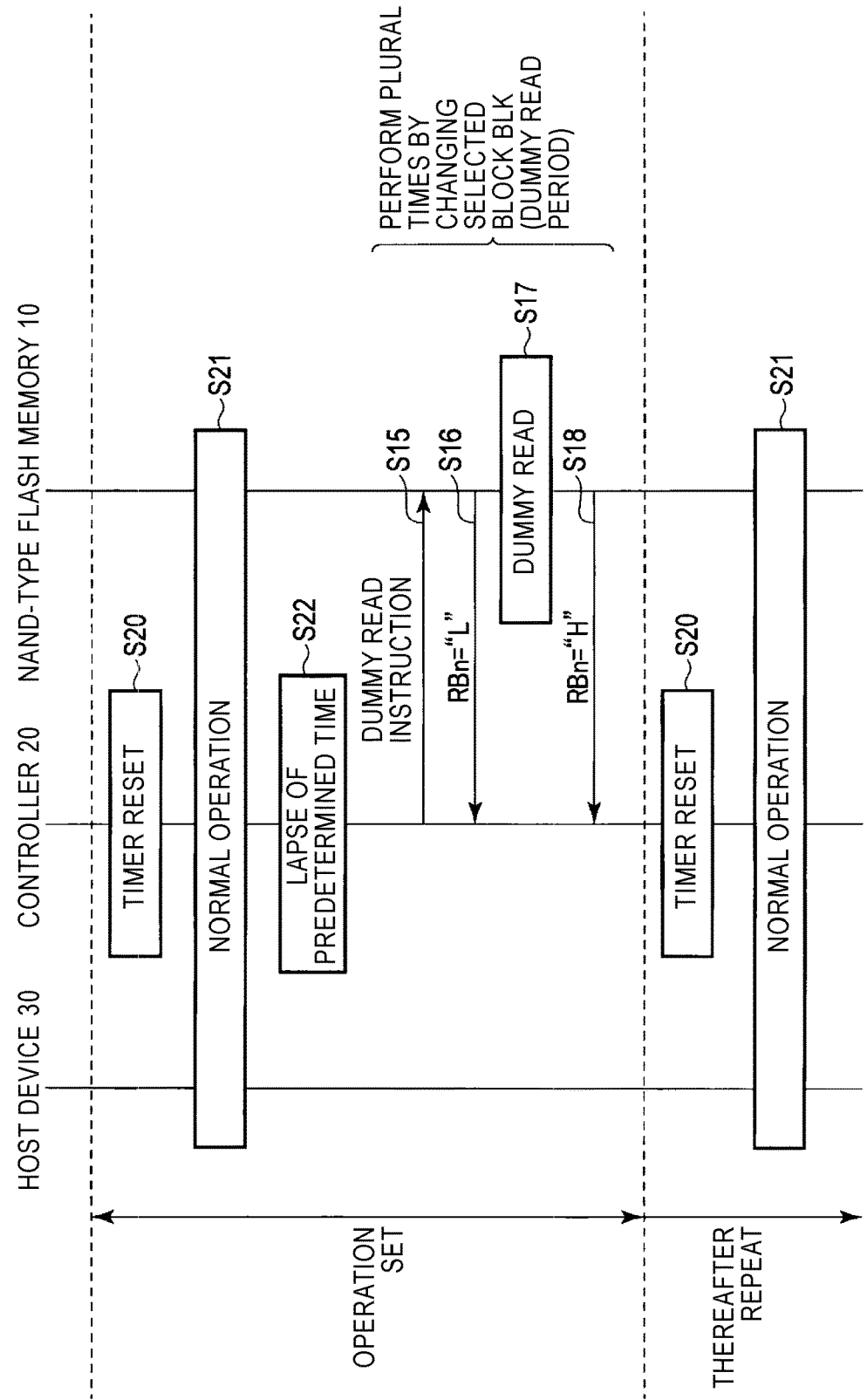
FIG. 19 is an operation flow chart in a memory system according to a ninth exemplary embodiment.

Hereinafter, the operation of the memory system 1 according to the present exemplary embodiment will be described with reference to FIG. 19. FIG. 19 illustrates an operation flow chart of the memory system 1 in the exemplary embodiment. The operations illustrated in FIG. 19 correspond to the operations following the completion of the dummy read period described in the first exemplary embodiment with reference to FIG. 7 (after step S18).

As illustrated in FIG. 19, first, the controller 20 resets the count of the timer 26 (step S20). By this operation, the timer 26 counts the elapsed time from the completion of the dummy read period. Then, the memory system 1 proceeds to a normal operation state in which operations are made in response to instructions from the host device 30 (step S21). In the normal operation, for example, the CPU 23 monitors the count of the timer 26.

Then, when the count of the timer 26 exceeds a predetermined time (step S22), the dummy read described in the first exemplary embodiment is executed after the operation, which is being executed when the predetermined time elapses, is ended. Specifically, the operations in steps S15 to S18 as described in the first exemplary embodiment are executed plural times by changing the selected block BLK.

The above described operations performed until the dummy read period ends from step S20 will be called an operation set. When dummy read operations for desired blocks BLK are completed by repeating operations in steps S15 to S18, the memory system 1 repeats the operation set.

Figure 20:
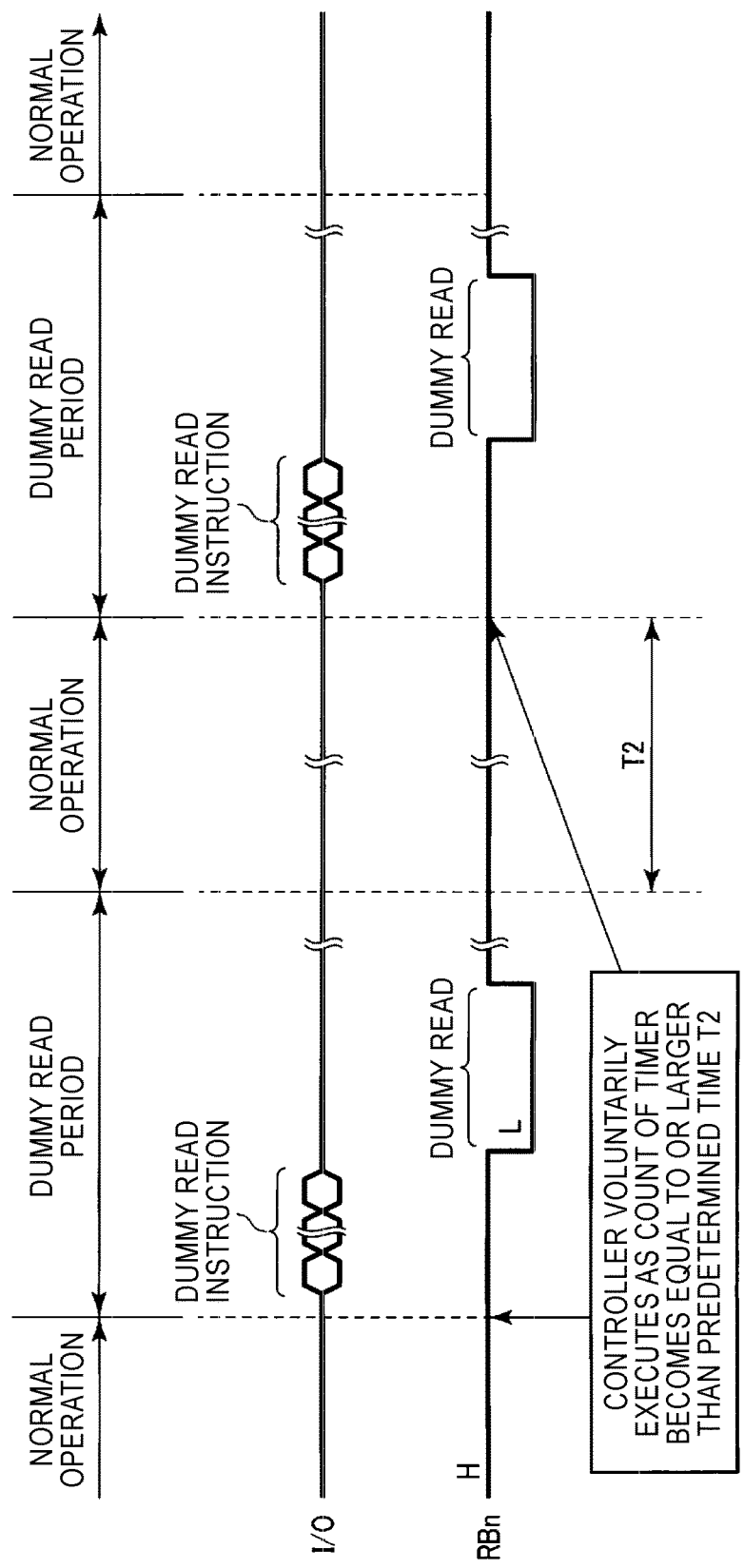
FIG. 20 is a view illustrating a command sequence and waveforms of operations in the memory system according to the ninth exemplary embodiment.

A specific example of the above described operation in FIG. 19 corresponds to FIG. 20. FIG. 20 illustrates detailed operations of the input signal I/O and the ready/busy signal RBn before and after the memory system 1 is powered ON.

In the example illustrated in FIG. 20, the controller 20 voluntarily executes the dummy read as the count of the timer becomes equal to or larger than a predetermined time T2. The time T2 serving as a reference by which the dummy read is executed again is determined when the timer 26 counts the elapsed time from the completion of the dummy read period as described above. The time T2 is set to, for example, 5 min. The time T2 may be arbitrarily set without being limited thereto.

[9-2] Effect of Ninth Exemplary Embodiment

As described above, the memory system 1 according to the present exemplary embodiment may maintain the threshold voltage distribution of the memory cell transistor MT in the second state by periodically inserting the dummy read during the normal operation. Accordingly, the semiconductor storage device 10 according to the present exemplary embodiment may suppress the fluctuation of the threshold voltage distribution of the memory cell transistor MT, thereby improving the reliability of the read operation.

Although the present exemplary embodiment has been described based on the memory system 1 described in the first to eighth exemplary embodiments, but is not limited thereto. For example, the dummy read may not be executed immediately after the Power On Reset, but the periodic dummy read as described in the exemplary embodiment may be executed. In this case, the timing when the dummy read is executed for the first time is set to an arbitrary timing.

[10] Tenth Exemplary Embodiment

Next, the memory system 1 according to the tenth exemplary embodiment will be described. In the present exemplary embodiment, in the semiconductor storage device 10 described in the first to ninth exemplary embodiments, the ground voltage is continuously applied to a word line WL after the read operation.

[10-1] Configuration of Semiconductor Storage Device 10

Figure 21:
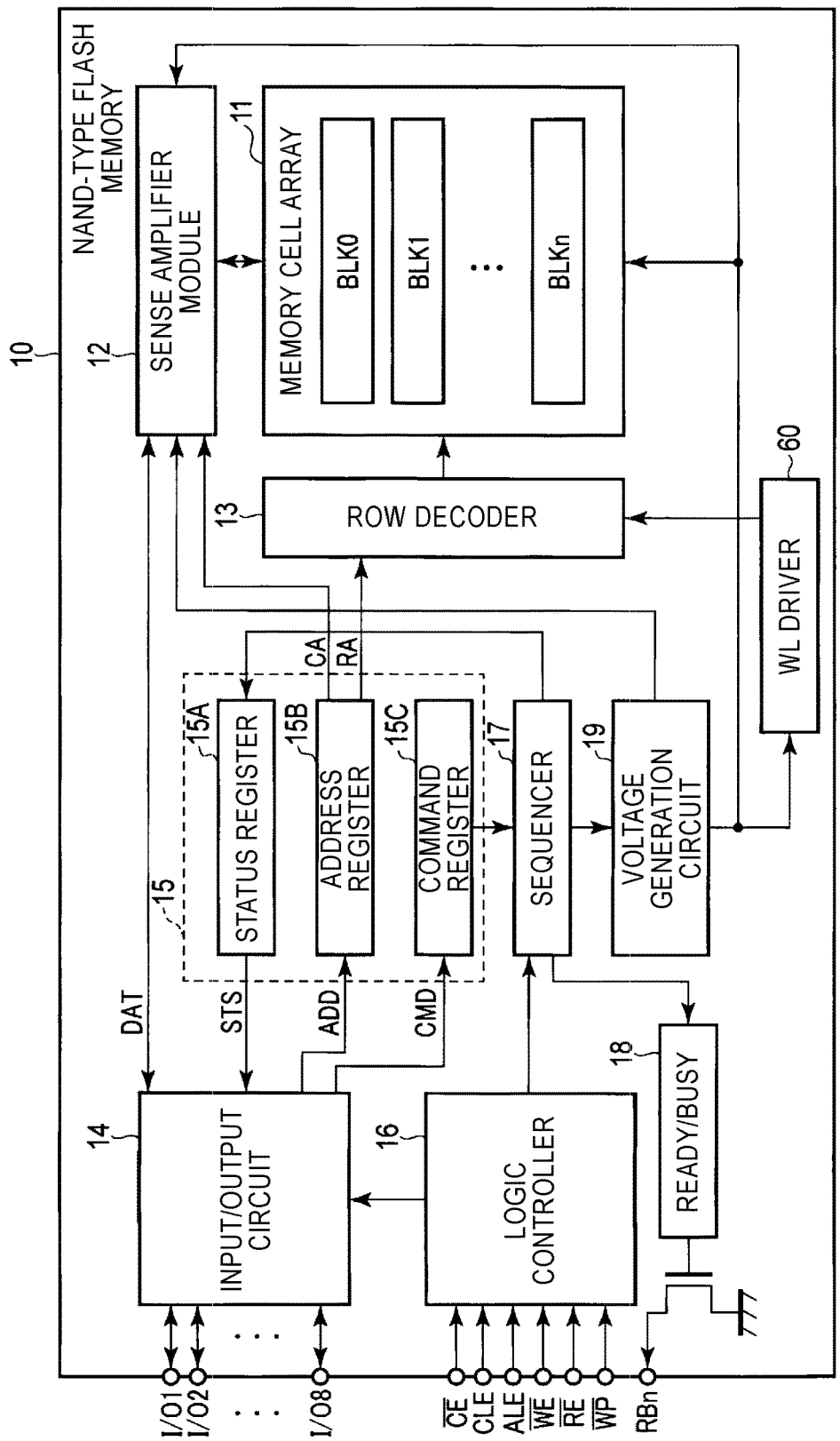
FIG. 21 is a block diagram of a semiconductor storage device according to a tenth exemplary embodiment.

Next, the configuration of the semiconductor storage device 10 in the exemplary embodiment will be described with reference to FIG. 21. FIG. 21 illustrates a block diagram of the semiconductor storage device 10 in the present exemplary embodiment. As illustrated in FIG. 21, the configuration of the semiconductor storage device 10 in the present exemplary embodiment is different that of the semiconductor storage device 10 described in the first exemplary embodiment with reference to FIG. 2, in that a word line driver 60 is further included.

The word line driver 60 is a circuit that receives the voltage generated by the voltage generation circuit 19, and supplies the voltage to the row decoder 13. The word line driver 60 may control the row decoder 13 to continuously apply, for example, the ground voltage to a word line WL of a block BLK that is unselected after various operations are executed. The various operations may include, for example, a read operation, dummy read, or the like. Other configurations are the same as those in the semiconductor storage device 10 described in the first exemplary embodiment with reference to FIG. 2, and thus descriptions thereof will be omitted.

[10-2] Effect of Tenth Exemplary Embodiment

Figure 22:
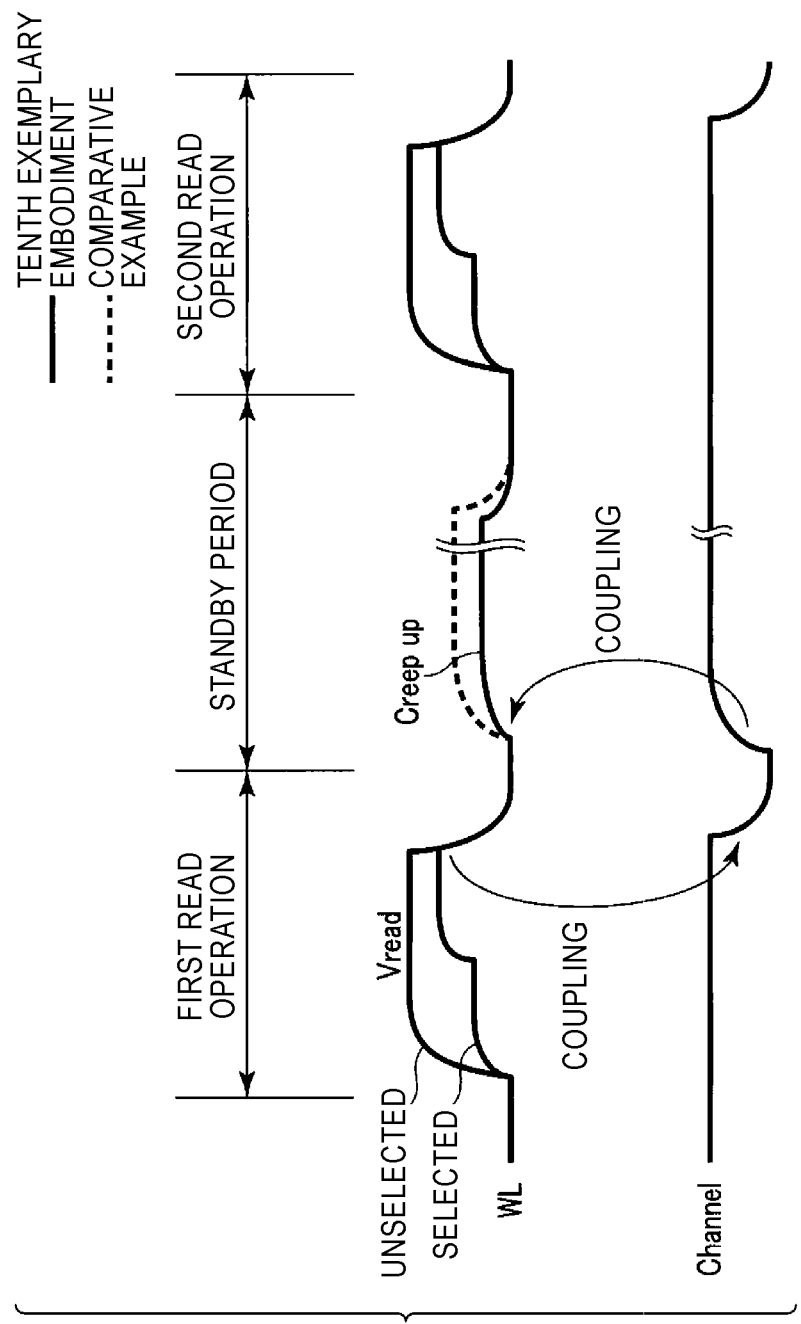
FIG. 22 is a waveform view illustrating an effect of a memory system according to the tenth exemplary embodiment.

According to the above described semiconductor storage device 10 according to the exemplary embodiment, the reliability of read data may be improved. Hereinafter, details of the effect will be described with reference to FIG. 22. FIG. 22 illustrates an example of waveforms of a word line WL, and a channel of a NAND string NS in various operations. In FIG. 22, the waveform described in FIG. 10 as a comparative example is indicated by broken line, and waveforms in the case where the word line driver 60 described in the present exemplary embodiment is used are indicated by solid line in addition to the comparative example.

When the word line driver 60 continuously applies the ground voltage to the word line WL of a block BLK that is unselected after the first read operation is executed, the word line WL is not placed in a floating state during the standby period. That is, as illustrated in FIG. 22, when the channel potential of the NAND string NS is fluctuated after the first read operation, an influence of coupling between the word line WL and the channel of the NAND string NS is suppressed. As a result, the memory system 1 according to the present exemplary embodiment may suppress a voltage rise of the word line WL due to the creep up compared to the comparative example illustrated in FIG. 22.

Accordingly, the memory system 1 according to the exemplary embodiment may suppress the fluctuation of the threshold voltage of the memory cell transistor MT due to the creep up compared to that of the first to ninth exemplary embodiments, thereby improving the reliability of the read operation.

[11] Eleventh Exemplary Embodiment

Next, the memory system 1 according to the eleventh exemplary embodiment will be described. In the present exemplary embodiment, in the memory system 1 described in the first to tenth exemplary embodiments, the ground voltage is continuously applied to the well line CPWELL after the read operation.

[11-1] Configuration of Semiconductor Storage Device 10

Figure 23:
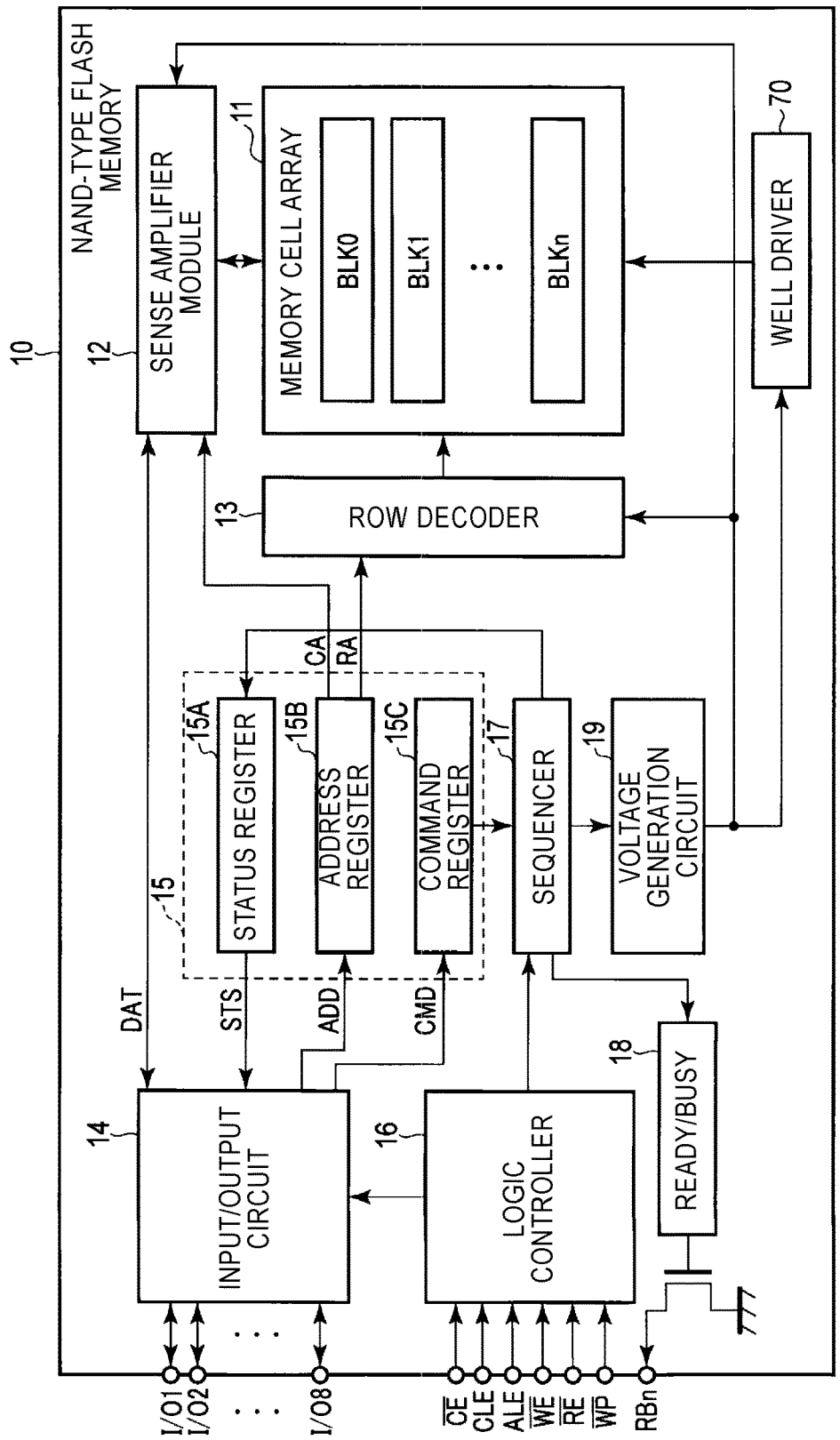
FIG. 23 is a block diagram of a semiconductor storage device according to an eleventh exemplary embodiment.

Hereinafter, the configuration of the semiconductor storage device 10 in the exemplary embodiment will be described with reference to FIG. 23. FIG. 23 illustrates a block diagram of the semiconductor storage device 10 in the present exemplary embodiment. As illustrated in FIG. 23, the configuration of the semiconductor storage device 10 in the present exemplary embodiment is different that of the semiconductor storage device 10 described in the first exemplary embodiment with reference to FIG. 2, in that a well driver 70 is further included.

The well driver 70 is a circuit that applies a voltage to the well line CPWELL provided in the memory cell array 11 based on the voltage generated by the voltage generation circuit 19. The well driver 70 may continuously applies, for example, the ground voltage to the well line CPWELL, for example, after various operations are completed since the various operations are executed. Specifically, the well driver 70 may continuously apply the ground voltage to the well line CPWELL, for example, after a read operation since the read voltage is applied to a selected word line WL during the read operation. Other configurations are the same as those in the semiconductor storage device 10 described in the first exemplary embodiment with reference to FIG. 2, and thus descriptions thereof will be omitted.

[11-2] Effect of Eleventh Exemplary Embodiment

Figure 24:
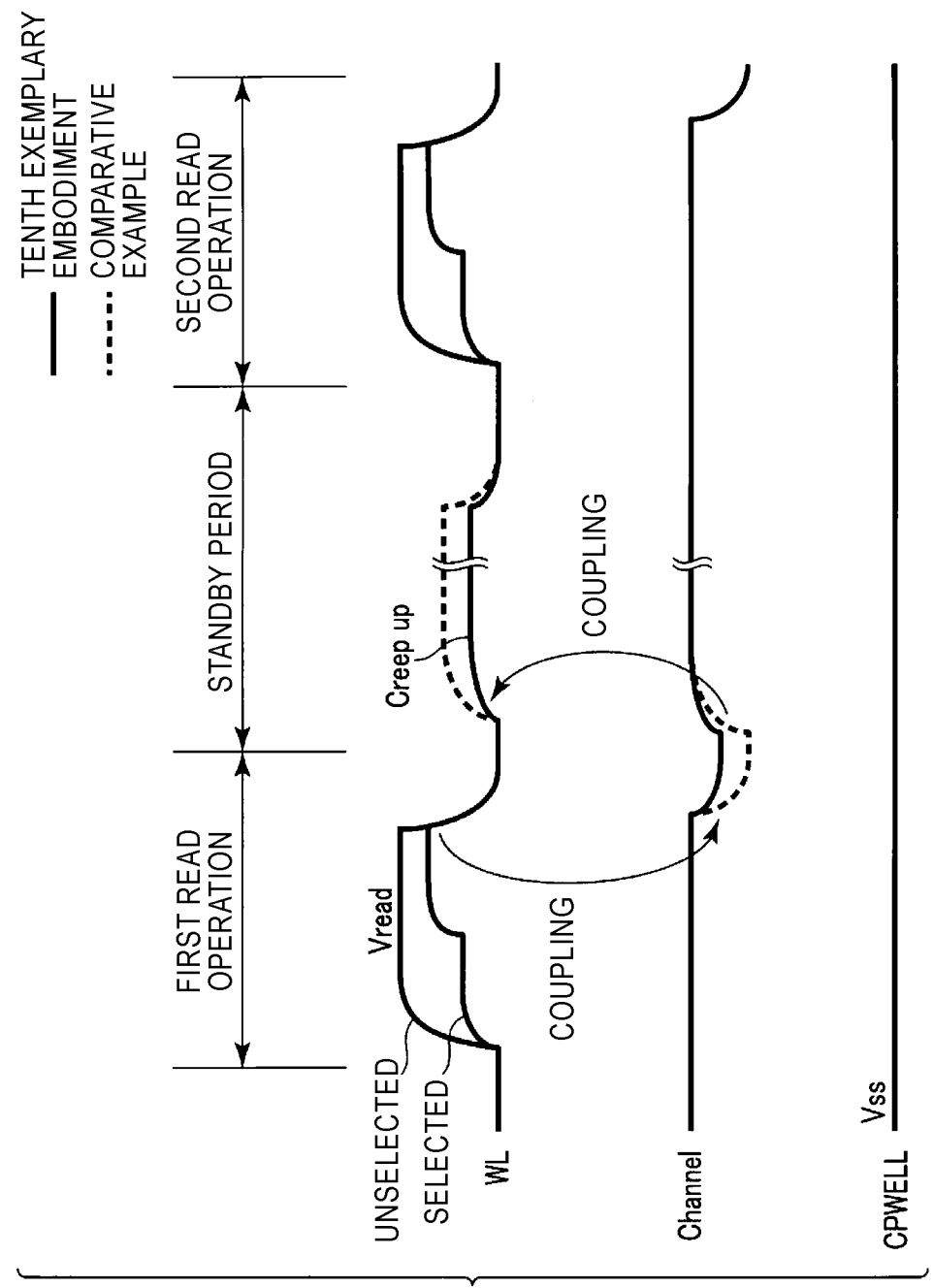
FIG. 24 is a waveform view illustrating an effect of a memory system according to the eleventh exemplary embodiment.

According to the above described semiconductor storage device 10 according to the present exemplary embodiment, the reliability of read data may be improved. Hereinafter, details of the effect will be described with reference to FIG. 24. FIG. 24 illustrates an example of waveforms of a word line WL, and a channel of a NAND string NS in various operations. In FIG. 24, the waveform described in FIG. 10 as a comparative example is indicated by broken line, and waveforms in the case where the well driver 70 described in the present exemplary embodiment is used are indicated by solid line in addition to the comparative example.

When the well driver 70 continuously applies the ground voltage to the well line CPWELL after a first read operation is completed since the first read operation is executed, the channel of the NAND string NS is not placed in a floating state during the standby period. That is, as illustrated in FIG. 24, the channel potential of the NAND string NS is suppressed from dropping due to the coupling after the first read operation. As a result, the memory system 1 according to the present exemplary embodiment may suppress a voltage rise of the word line WL due to the creep up as compared to the comparative example illustrated in FIG. 24.

Accordingly, the memory system 1 according to the present exemplary embodiment may suppress the fluctuation of the threshold voltage of the memory cell transistor MT due to the creep up compared to that of the first to ninth exemplary embodiments, thereby improving the reliability of the read operation.

[12] Modified Example or the Like

A memory system 1 according to the exemplary embodiments described above includes a semiconductor storage device <10, FIG. 1> including a memory cell that holds data in a non-volatile state, and a controller <20, FIG. 1> capable of instructing a semiconductor storage device to perform first and second operations. The first operation <FIG. 9, a read operation> is an operation in which the semiconductor storage device reads data from the memory cell, and outputs the read data to the controller. The second operation <FIG. 9, dummy read> is an operation in which the semiconductor storage device reads data from the memory cell and does not output the read data to the controller and write the data to the memory cell. The controller may instruct the semiconductor storage device to perform the second operation without receiving a command from the external host device <30, FIG. 1>, <FIG. 7>.

Therefore, it is possible to provide a semiconductor storage device capable of improving the reliability of a read operation.

The operation of a memory system 1 in the exemplary embodiments described above is implemented by applying, for example, firmware incorporating the operations, to a system equipped with a NAND-type flash memory.

In the first exemplary embodiment, the case where the controller 20 detects that the Power On Reset of the semiconductor storage device 10 ends and instructs dummy read is described as an example, but the present disclosure is not limited thereto. For example, the semiconductor storage device 10 may incorporate the dummy read for each block BLK into operations performed until the semiconductor storage device 10 is firstly placed in a ready state since the semiconductor storage device 10 is powered ON. Specifically, the semiconductor storage device 10 may operates to execute the dummy read for each block BLK after the Power On Reset, and then to shift to a ready state.

In the exemplary embodiments described above, the case where each command sequence includes an address signal ADD of one cycle is described as an example, but the present disclosure is not limited thereto. For example, in each command sequence, the controller 20 may transmit, for example, plane information, a block address, a page address, a column address, and the like to the semiconductor storage device 10 using address signals ADD of a plurality of cycles.

In the exemplary embodiments as described above, the case where the semiconductor storage device 10 shifts from a busy state to a ready state based on transmission of data read by the dummy read from the sense amplifier SA to other latch circuits is described as an example, but the present disclosure is not limited thereto. For example, the semiconductor storage device 10 may shift from a busy state to a ready state based on a fact that any operation is executed or completed until read data are transmitted to a latch circuit since the dummy read are executed.

In the exemplary embodiments described above, the case where the memory system 1 does not transmit read data to the controller 20 from the semiconductor storage device 10 in the dummy read is described as an example, but the present disclosure is not limited thereto. For example, the semiconductor storage device 10 may transmit all data read by the dummy read to the controller 20, or may transmit a part of the data to the controller 20.

The dummy read operations in which various methods described in the first to eighth exemplary embodiments are employed are separately used according to, for example, the number of bits of data held by one memory cell transistor MT. For example, as a reading method applied to the dummy read, a method of reading data of a memory cell transistor MT which stores the number of bits equal to or less than the number of bits of data held by a memory cell transistor MT in a block BLK for which the dummy read is executed is applied. That is, when the memory cell transistor MT is capable of storing data of n bits (n is 1 or more), the command set by which the controller 20 instructs the semiconductor storage device 10 to perform dummy read includes a command (e.g., A2h or the like) for instructing a read operation on a memory cell transistor MT that stores data of m bits (m is 1 or more and n or less).

In the exemplary embodiments described above, the memory cell array 11 may not have a structure where memory cells are three-dimensionally stacked above a semiconductor substrate. That is, the memory cell array 11 of the semiconductor storage device 10 may have a structure where memory cells are two-dimensionally arranged on a semiconductor substrate.

In this specification, "connection" indicates electrical connection, and does not exclude, for example, another element interposed in the connection.

In each of the exemplary embodiments as described above, (1) In a read operation, a voltage applied to a word line selected for an "A" level read operation ranges from, for example, 0 V to 0.55 V. The present disclosure is not limited thereto, but it is possible to employ any one of ranges from 0.1 V to 0.24 V, from 0.21 V to 0.31 V, from 0.31 V to 0.4 V, from 0.4 V to 0.5 V, and from 0.5 V to 0.55 V.

A voltage applied to a word line selected for a "B" level read operation ranges from, for example, 1.5V to 2.3V. The present disclosure is not limited thereto, but may adopt any one of ranges from 1.65 V to 1.8V, from 1.8 V to 1.95V, from 1.95V to 2.1V, and from 2.1V to 2.3V.

A voltage applied to a word line selected for a "C" level read operation ranges from, for example, 3.0 V to 4.0V. The present disclosure is not limited thereto, but it is possible to employ any one of ranges from 3.0 V to 3.2V, from 3.2V to 3.4V, from 3.4V to 3.5V, from 3.5 to 3.6V, and from 3.6V to 4.0V.

The time (tRead) for the read operation may range from, for example, 25 μs to 38 μs, from 38 μs to 70 μs, or from 70 μs to 80 μs.

(2) A write operation includes a program operation and a verification operation as described above. In the write operation, the voltage firstly applied to a word line selected during the program operation ranges from, for example, 13.7V to 14.3V. The present disclosure is not limited thereto, but the voltage may range from, for example, 13.7V to 14.0V or from 14.0V to 14.6V.

A voltage firstly applied to a selected word line when writing is performed on an odd numbered word line and a voltage firstly applied to a selected word line when writing is performed on an even numbered word line may be changed.

When the program operation is performed using an incremental step pulse program (ISPP) method, for example, about 0.5V may be exemplified as a voltage for step-up.

A voltage applied to an unselected word line may range from, for example, 6.0V to 7.3V. However, without being limited thereto, the voltage may range from, for example, 7.3V to 8.4V, or may be 6.0V or less.

A pass voltage to be applied may be changed depending on whether an unselected word line is an odd numbered word line, or an even numbered word line.

The time (tProg) for the write operation may range from, for example, 1700 μs to 1800 μs, from 1800 μs to 1900 μs, or from 1900 μs to 2000 μs.

(3) In an erasing operation, a voltage firstly applied to a well, which is formed on a semiconductor substrate, and on which the memory cells are arranged, ranges from, for example, 12.0V to 13.6V. However, without being limited thereto, the voltage may range from, for example, 13.6V to 14.8V, from 14.8V to 19.0V, from 19.0V to 19.8V, or from 19.8V to 21.0V.

The time (tErase) for the erasing operation may range from, for example, 3000 μs to 4000 μs, from 4000 μs to 5000 μs, or from 4000 μs to 9000 μs.

(4) The structure of a memory cell has a charge storage layer disposed on a semiconductor substrate (a silicon substrate) with a tunnel insulating film having a film thickness ranging from 4 nm to 10 nm interposed therebetween. The charge storage layer may have a structure in which an insulating film made of SiN, SiON, or the like having a film thickness ranging from 2 nm to 3 nm, and polysilicon having a film thickness ranging from 3 nm to 8 nm are stacked. A metal such as Ru may be added to the polysilicon. On the charge storage layer, an insulating film is provided. The insulating film includes, for example, a silicon oxide film having a film thickness ranging from 4 nm to 10 nm and interposed between a lower-layer High-k film having a film thickness ranging from 3 nm to 10 nm and an upper-layer High-k film having a film thickness ranging from 3 nm to 10 nm. The High-k film may be HfO or the like. The film thickness of the silicon oxide film may be thicker than the film thickness of the High-k film. A control electrode having a film thickness ranging from 30 nm to 70 nm is formed on the insulating film via a material having a film thickness ranging from 3 nm to 10 nm. Here, the material is a metal oxide film such as TaO, or a metal nitride film such as TaN. W or the like may be used for the control electrode.

An air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a semiconductor storage device including a plurality of blocks of memory cells, the blocks including a first block and a second block, each memory cell storing data in a non-volatile state; and
   a controller configured to issue commands to the semiconductor storage device to perform operations, including a read operation, a write operation, an erase operation, and a dummy operation, wherein
   the controller issues a command to the semiconductor storage device to perform each of the read, write, and erase operations, in response to a corresponding command received from a host device,
   upon receiving a ready signal from the semiconductor storage device after the memory system is turned ON based on supply of power from the host device, and independently of any command received from the host device, the controller issues a first command to the semiconductor storage device to perform the dummy operation on a memory cell of the first block, and then a second command to the semiconductor storage device to perform the dummy operation on a memory cell of the second block,
   the read operation is an operation in which the semiconductor storage device reads data from a memory cell of a block in the semiconductor storage device, and outputs the read data to the controller, and
   the dummy operation is an operation in which the semiconductor storage device reads data from a memory cell of a block in the semiconductor storage device and does not output the read data to the controller and does not write the data to any of the memory cells of the blocks in the semiconductor storage device.

2. The memory system according to claim 1, wherein
   after having issued the first and second commands, the controller issues a third command to the semiconductor storage device to perform the dummy operation on a memory cell of the first block.

3. The memory system according to claim 2, wherein the controller issues the third command only after a predetermined amount of time has elapsed since the issuing of the first command.

4. The memory system according to claim 1, wherein the read operation on a memory cell of a block in the semiconductor storage device is prevented from being executed until a predetermined amount of time has elapsed since the dummy operation was performed on a memory cell of the block.

5. The memory system according to claim 1, wherein
   the memory cells are each capable of storing data of n bits (where n is greater than or equal to 1), and
   the dummy operation is an operation in which the semiconductor storage device reads data of m bits (m is greater than or equal to 1 and less than or equal to n).

6. The memory system according to claim 1, wherein
   the semiconductor storage device further includes first and second planes, each of which includes a plurality of memory cells and is independently controllable, and
   the dummy operation is executed for the first and second planes in parallel.

7. A method of performing a read operation on a memory cell of a non-volatile semiconductor storage device including a plurality of blocks of memory cells, the blocks including a first block and a second block, said method comprising:

receiving a supply of power sufficient to turn ON the non-volatile semiconductor storage device from a host device;

issuing a command to the non-volatile semiconductor storage device to perform each of a read operation, a write operation, and an erase operation in response to a corresponding command received from the host device; and upon receiving a ready signal from the non-volatile semiconductor storage device after the non-volatile semiconductor storage device is turned ON, and independently of any command received from the host device, issuing a first command to the non-volatile semiconductor storage device to perform a dummy operation on a memory cell of the first block, and then a second command to the non-volatile semiconductor storage device to perform the dummy operation on a memory cell of the second block, wherein the read operation is an operation in which the non-volatile semiconductor storage device reads data from a memory cell of a block in the non-volatile semiconductor storage device, and outputs the read data to the controller, and the dummy operation is an operation in which the non-volatile semiconductor storage device reads data from a memory cell of a block in the non-volatile semiconductor storage device and does not output the read data to the controller and does not write the data to any of the memory cells of the blocks in the non-volatile semiconductor storage device.

8. The method according to claim 7, further comprising: after issuing the first and second commands, issuing a third command to the non-volatile semiconductor storage device to perform the dummy operation on a memory cell of the first block.

9. The method according to claim 8, wherein the third command is issued only after a predetermined amount of time has elapsed since the issuing of the first command.

10. The method according to claim 7, wherein the read operation on a memory cell of a block in the non-volatile semiconductor storage device is prevented from being executed until a predetermined amount of time has elapsed since the dummy operation was performed on a memory cell of the block.

11. The method according to claim 7, wherein memory cells of a block in the non-volatile semiconductor storage device include a first memory cell and a second memory cell that are connected in series between first and second select transistors, the first select transistor having a first end connected to the second memory cell with no other memory cell interposed therebetween and a second end connected to a bit line, and first and second word lines connected to gates of the first and second memory cells, respectively, and in the dummy operation, a read voltage is applied to the first word line and another voltage lower than the read voltage and higher than a ground voltage is applied to the second word line.

12. The method according to claim 7, wherein the memory cells are each capable of storing data of n bits (where n is greater than or equal to 1), and the dummy operation is an operation in which the non-volatile semiconductor storage device reads data of m bits (m is greater than or equal to 1 and less than or equal to n).

13. The method according to claim 7, wherein the non-volatile semiconductor storage device further includes first and second planes, each of which includes a plurality of memory cells and is independently controllable, and the dummy operation is executed for the first and second planes in parallel.

14. A memory system comprising:

a semiconductor storage device including a plurality of blocks of memory cells, each memory cell storing data in a non-volatile state, memory cells in a block of the semiconductor storage device including a first memory cell and a second memory cell, that are connected in series between first and second select transistors, the first select transistor having a first end connected to the second memory cell with no other memory cell interposed therebetween and a second end connected to a bit line, and first and second word lines connected to gates of the first and second memory cells, respectively; and a controller configured to issue commands to the semiconductor storage device to perform operations, including a read operation, a write operation, an erase operation, and a dummy operation, wherein the read operation is an operation in which the semiconductor storage device reads data from a memory cell of a block in the semiconductor storage device, and outputs the read data to the controller, and the dummy operation is an operation in which the semiconductor storage device reads data from the first memory cell of the block in the semiconductor storage device by applying a read voltage to the first word line and another voltage lower than the read voltage and higher than a ground voltage to the second word line, and does not output the read data to the controller and does not write the data to any of the memory cells of the blocks in the semiconductor storage device.

15. The memory system according to claim 14, wherein the controller issues a command to the semiconductor storage device to perform each of the read, write, and erase operations, in response to a corresponding command received from a host device, and the controller issues a command to the semiconductor storage device to perform the dummy operation independently of any command received from the host device.

16. The memory system according to claim 15, wherein the memory system is turned ON based on supply of power from the host device, and the controller issues the command to the semiconductor storage device to perform the dummy operation upon receiving a ready signal from the semiconductor storage device after the memory system is turned ON.

17. The memory system according to claim 16, wherein the blocks include a first block and a second block, and upon receiving the ready signal from the semiconductor storage device after the memory system is turned ON, the controller issues a first command to the semiconductor storage device to perform the dummy operation on a memory cell of the first block, and then a second command to the semiconductor storage device to perform the dummy operation on a memory cell of the second block.

18. The memory system according to claim 17, wherein after having issued the first and second commands, the controller issues a third command to the semiconductor storage device to perform the dummy operation on a memory cell of the first block.

19. The memory system according to claim 18, wherein the controller issues the third command only after a predetermined amount of time has elapsed since the issuing of the first command.

20. The memory system according to claim 14, wherein the read operation on a memory cell of a block in the semiconductor storage device is prevented from being executed until a predetermined amount of time has elapsed since the dummy operation was performed on a memory cell of the block.

* * * * *